(12) United States Patent
Tanaka et al.

(10) Patent No.: US 8,451,430 B2
(45) Date of Patent: May 28, 2013

(54) ILLUMINATION OPTICAL SYSTEM, EXPOSURE APPARATUS, AND DEVICE MANUFACTURING METHOD

(75) Inventors: Hirohisa Tanaka, Kumagaya (JP); Hiroyuki Hirota, Sagamihara (JP)

(73) Assignee: Nikon Corporation, Tokyo (JP)

( * ) Notice: Subject to any disclaimer, the term of this patent is extended or adjusted under 35 U.S.C. 154(b) by 162 days.

(21) Appl. No.: 13/166,316

(22) Filed: Jun. 22, 2011

(65) Prior Publication Data

US 2012/0013877 A1    Jan. 19, 2012

Related U.S. Application Data

(63) Continuation of application No. PCT/JP2009/067339, filed on Oct. 5, 2009.

(60) Provisional application No. 61/193,801, filed on Dec. 24, 2008.

(30) Foreign Application Priority Data

Dec. 25, 2008 (JP) ................ P2008-331510

(51) Int. Cl.
*G03B 27/72* (2006.01)
*G03B 27/54* (2006.01)
*G03B 27/68* (2006.01)
*G03B 27/42* (2006.01)
*G03B 27/52* (2006.01)

(52) U.S. Cl.
USPC ............... 355/71; 355/52; 355/53; 355/55; 355/67

(58) Field of Classification Search
USPC .......... 355/52, 53, 55, 67–71, 77; 250/492.1, 250/492.2, 492.22, 548; 430/5, 8, 22, 30, 430/311, 312, 321; 359/308, 891
See application file for complete search history.

(56) References Cited

U.S. PATENT DOCUMENTS 3,806,249 A * 4/1974 Lesinski ............... 356/45
5,420,417 A * 5/1995 Shiraishi .............. 250/205
(Continued)

FOREIGN PATENT DOCUMENTS

JP    06-124873    5/1994
JP    09-190969    7/1997
(Continued)

OTHER PUBLICATIONS

International Search Report, mailed Dec. 28, 2009.

*Primary Examiner* — Toan Ton
*Assistant Examiner* — Christina Riddle

(57) ABSTRACT

According to one embodiment, an illumination optical system comprises an optical integrator which forms a secondary light source on an illumination pupil plane in an illumination optical path of the illumination optical system with incidence of exposure light from a light source device thereinto; a first transmission filter arranged in an optical path of the exposure light emitted from a first surface illuminant of the secondary light source and having a transmittance characteristic varying according to angles of incidence of the exposure light; a second transmission filter arranged in an optical path of the exposure light emitted from a second surface illuminant of the secondary light source and having a transmittance characteristic varying according to the angles of incidence of the exposure light; and a rotation mechanism which rotates the first and second transmission filters so as to vary an angle of inclination thereof relative to the optical axis of the illumination optical system.

37 Claims, 22 Drawing Sheets

U.S. PATENT DOCUMENTS

| | | | |
|---|---|---|---|
| 6,404,499 B1 * | 6/2002 | Stoeldraijer et al. | 356/400 |
| 6,771,350 B2 * | 8/2004 | Nishinaga | 355/53 |
| 6,819,403 B2 * | 11/2004 | Komatsuda | 355/71 |
| 2003/0038225 A1 | 2/2003 | Mulder et al. | |
| 2006/0055834 A1 * | 3/2006 | Tanitsu et al. | 349/5 |
| 2006/0170901 A1 | 8/2006 | Tanitsu et al. | |
| 2006/0203214 A1 | 9/2006 | Shiraishi | |
| 2007/0146676 A1 | 6/2007 | Tanitsu et al. | |
| 2007/0236933 A1 * | 10/2007 | Bierhuizen et al. | 362/293 |
| 2007/0296936 A1 | 12/2007 | Kato et al. | |
| 2008/0030707 A1 | 2/2008 | Tanaka et al. | |
| 2009/0002673 A1 * | 1/2009 | Shinoda | 355/71 |
| 2009/0257043 A1 | 10/2009 | Mori et al. | |

FOREIGN PATENT DOCUMENTS

| | | |
|---|---|---|
| JP | 2787133 | 6/1998 |
| JP | 10-303114 | 11/1998 |
| JP | 11-274060 | 10/1999 |
| JP | 2002-353105 | 12/2002 |
| JP | 2003-0243276 | 8/2003 |
| JP | 2003-318087 | 11/2003 |
| JP | 2004-304135 | 10/2004 |
| JP | 2006-054328 | 2/2006 |
| JP | 2006-059834 | 3/2006 |
| JP | 2009-111175 | 5/2009 |
| WO | WO 99/49504 | 9/1999 |

\* cited by examiner

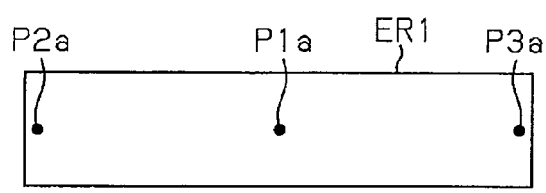
Fig.4A
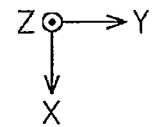
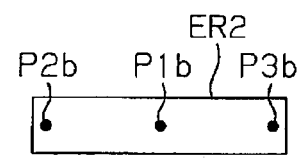
Fig.4B

ILLUMINATION OPTICAL SYSTEM, EXPOSURE APPARATUS, AND DEVICE MANUFACTURING METHOD

CROSS-REFERENCE TO RELATED APPLICATION

This application is a continuation application of PCT/JP2009/067339 filed Oct. 5, 2009 claiming the benefits of priorities of the U.S. Provisional Application No. 61/193,801 filed on Dec. 24, 2008 and the Japanese Patent Application No. 2008-331510 filed on Dec. 25, 2008, the entire contents of which are incorporated herein by reference.

BACKGROUND

1. Field

One embodiment of the invention relates to an illumination optical system, an exposure apparatus provided with the illumination optical system, and a device manufacturing method using the exposure apparatus.

2. Description of the Related Art

In general, an exposure apparatus for manufacturing microdevices such as semiconductor integrated circuits is provided with an illumination optical system for guiding exposure light emitted from a light source, to a mask such as a reticle on which a predetermined pattern is formed. The illumination optical system is provided with a fly's eye lens as an optical integrator. When the exposure light is incident into the fly's eye lens, a predetermined light intensity distribution is formed on an illumination pupil plane which is optically in a Fourier transform relation with an illumination target surface of a mask on the exit plane side of the fly's eye lens (the predetermined light intensity distribution will be referred to hereinafter as "pupil intensity distribution"). The illumination pupil plane on which the pupil intensity distribution is formed is also referred to as a secondary light source consisting of a large number of surface illuminants.

The exposure light emitted from the secondary light source is condensed by a condenser lens and thereafter illuminates the mask in a superimposed manner. Then the exposure light passing through the mask travels through a projection optical system to illuminate a region on a substrate such as a wafer coated with a photosensitive material. As a result, the pattern of the mask is projected for exposure (or transferred) onto the substrate.

Incidentally, integration (micronization) of the pattern formed on the mask has been becoming higher and higher in recent years. For accurately transferring the microscopic pattern of the mask onto the substrate, it is therefore essential to form an illumination region with a uniform illuminance distribution (which will also be referred to as "still exposure region") on the substrate. A conventional technology for accurately transferring the microscopic pattern of the mask onto the substrate was to form the pupil intensity distribution, for example, of an annular shape or a multi-polar shape (dipolar, quadrupolar, or other shape) on the illumination pupil plane so as to improve the depth of focus and the resolving power of the projection optical system

SUMMARY

According to one embodiment, an illumination optical system for illuminating an illumination target surface with light from a light source, comprising:

an optical integrator which forms a predetermined light intensity distribution on an illumination pupil plane in an illumination optical path of the illumination optical system with incidence of the light from the light source thereinto;

a first transmission filter arranged in an optical path of a first illumination beam passing through a first region in the illumination pupil plane and having a transmittance characteristic varying according to angles of incidence of the light;

a second transmission filter arranged in an optical path of a second illumination beam passing through a second region different from the first region in the illumination pupil plane and having a transmittance characteristic varying according to the angles of incidence of the light; and a rotation mechanism which rotates the first and second transmission filters so as to vary an angle of inclination thereof relative to an optical axis of the illumination optical system.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 4A is an exemplary schematic diagram showing an illumination region formed on a reticle and FIG. 4B is an exemplary schematic diagram showing a still exposure region formed on a wafer;

DETAILED DESCRIPTION

Various embodiments will be described hereinafter with reference to the accompanying drawings.

First Embodiment

Figure 1:
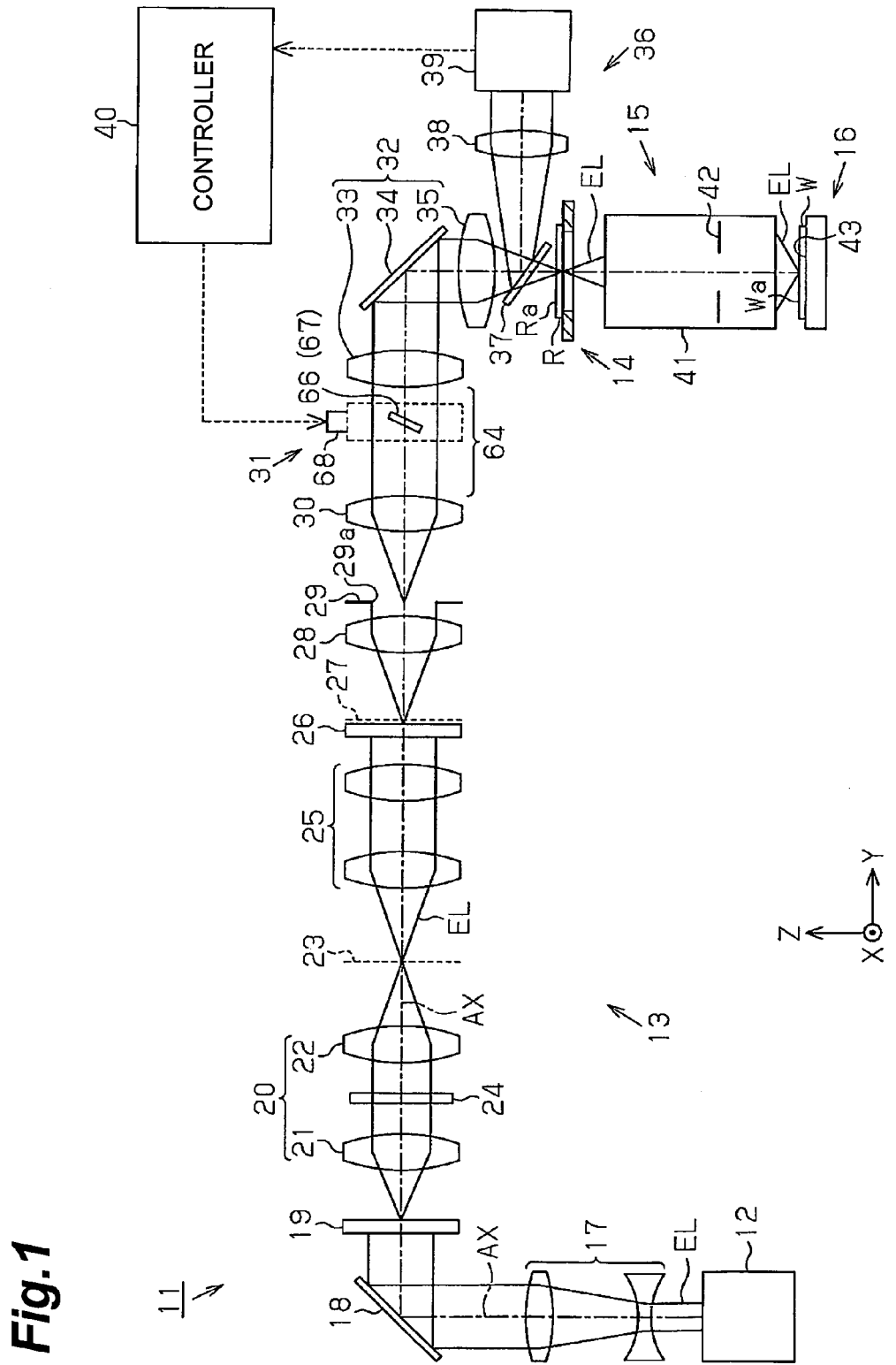
FIG. 1 is an exemplary schematic configuration diagram showing an exposure apparatus in the first embodiment.

As shown in FIG. 1, an exposure apparatus 11 of the first embodiment is a device for projecting an image of a circuit pattern onto a wafer W a surface Wa (which is a surface on the +Z-directional side and the top surface in FIG. 1) of which is coated with a photosensitive material such as a resist, while illuminating a transmission type reticle R with the predetermined circuit pattern formed thereon, with exposure light EL. This exposure apparatus 11 is provided with an illumination optical system 13 which guides the exposure light EL emitted from a light source device 12, to an illumination target surface Ra (surface on the +Z-directional side) of the reticle R, a reticle stage 14 holding the reticle R, a projection optical system 15 which guides the exposure light EL passing through the reticle R, to the surface Wa of the wafer W, and a wafer stage 16 holding the wafer W. The light source device 12 in the first embodiment has an ArF excimer laser light source to output light at the wavelength of 193 nm and a beam emitted from the ArF excimer laser light source is guided as the exposure light EL into the exposure apparatus 11.

The illumination optical system 13 is provided with a shaping optical system 17 for converting the exposure light EL emitted from the light source device 12, into a parallel beam of a predetermined sectional shape (e.g., a nearly rectangular cross section), and a first reflecting mirror 18 which reflects the exposure light EL emitted from the shaping optical system 17, to the reticle R side (the +Y-directional side and the right side in FIG. 1). A diffraction optical element 19 is provided on the exit side (reticle R side) of this first reflecting mirror 18. This diffraction optical element 19 is constructed by forming a plurality of blocks having the pitch nearly equal to the wavelength of the exposure light EL, in a glass substrate and has an action to diffract the exposure light EL incident from the entrance side (light source device 12 side), at predetermined angles. For example, in a case where the diffraction optical element 19 is one for annular illumination, when the exposure light EL is incident as a parallel beam of a nearly rectangular cross section from the entrance side into the diffraction optical element 19, the diffraction optical element 19 emits a beam of an annular (nearly ring-like) sectional shape to the reticle R side. In a case where the diffraction optical element 19 is one for multi-polar (dipolar, quadrupolar, octupolar, or other) illumination, when the exposure light EL is incident as a parallel beam of a nearly rectangular cross section from the entrance side into the diffraction optical element 19, the diffraction optical element 19 emits a plurality of (e.g., four) beams according to the number of poles, to the reticle R side.

The illumination optical system 13 is provided with an afocal optical system 20 into which the exposure light EL emitted from the diffraction optical element 19 is incident (which is also called "afocal optic"). This afocal optical system 20 has a first lens unit 21 (only one lens of which is illustrated in FIG. 1), and a second lens unit 22 disposed on the exit side with respect to the first lens unit 21 (only one lens of which is illustrated in FIG. 1). The afocal optical system 20 is formed in such a manner that the entrance-side focal position of the afocal optical system 20 is approximately coincident with the installation position of the diffraction optical element 19 and that the exit-side focal position of the afocal optical system 20 is approximately coincident with a position of a predetermined plane 23 indicated by a dashed line in FIG. 1.

In the optical path between the first lens unit 21 and the second lens unit 22, a correction filter 24 having a transmittance distribution of different transmittances according to positions of incidence of the exposure light EL is provided at or near a position optically conjugate with an illumination pupil plane 27 of a below-described optical integrator 26. This correction filter 24 is a filter obtained by forming a pattern of light-blocking dots comprised of chromium or chromium oxide on a glass substrate having an entrance plane and an exit plane parallel to each other.

A zoom optical system 25 for varying the σ value (σ value=numerical aperture on the reticle R side of the illumination optical system 13/numerical aperture on the reticle R side of the projection optical system 15) is provided on the reticle R side of the afocal optical system 20 and the zoom optical system 25 is arranged on the exit side with respect to the predetermined plane 23. The exposure light EL to be emitted from the zoom optical system 25 is converted into a parallel beam by the zoom optical system 25 and thereafter the parallel beam is incident into the optical integrator 26 arranged on the exit side of the zoom optical system 25. Then the optical integrator 26 divides the wavefront of the incident exposure light EL into a plurality of beams and forms a predetermined light intensity distribution (also referred to as "pupil intensity distribution") on the illumination pupil plane 27 located on the exit side (+Y-directional side) thereof. The illumination pupil plane 27 on which the pupil intensity distribution is formed is also referred to as a secondary light source 60 consisting of a large number of surface illuminants (cf. FIG. 3).

The optical integrator 26 is arranged in such a manner that an entrance plane thereof (a plane on the −Y-directional side and the left plane in FIG. 1) is located at or near the exit-side focal position (also referred to as a pupil plane) of the zoom optical system 25. Namely, the zoom optical system 25 is arranged at the position so as to keep the predetermined plane 23 and the entrance plane of the optical integrator 26 in a substantial Fourier transform relation and so as to keep the pupil plane of the afocal optical system 20 (i.e., the installation position of the correction filter 24) and the entrance plane of the optical integrator 26 substantially optically conjugate with each other.

On the exit side of the optical integrator 26, there is an unshown illumination aperture stop, which is arranged at a position substantially optically conjugate with an entrance pupil plane of the projection optical system 15 and which is provided for defining a range of contribution of the secondary light source 60 to illumination. This illumination aperture stop has a plurality of aperture portions of different sizes and shapes. In the illumination aperture stop, an aperture portion corresponding to the cross-sectional shape of the exposure light EL emitted from the secondary light source 60 is located in the optical path of the exposure light EL. Specifically, in a case where the cross-sectional shape of the exposure light EL emitted from the secondary light source 60 is annular, the illumination aperture stop is driven so as to locate the aperture portion of the shape corresponding to the annular shape in the optical path of the exposure light EL. In a case where the cross-sectional shape of the exposure light EL emitted from the secondary light source 60 is quadrupolar, the illumination aperture stop is driven so as to locate the aperture portion of the shape corresponding to the quadrupolar shape in the optical path of the exposure light EL.

On the exit side of the optical integrator 26 and the illumination aperture stop, there are a first condenser optical system 28 composed of at least one lens (only one lens of which is illustrated in FIG. 1), and a reticle blind 29 (also referred to as "mask blind") arranged on the exit side of the first condenser optical system 28 and at a position optically conjugate with the illumination target surface Ra of the reticle R. The first condenser optical system 28 is composed of an optical element (lens) having a power (inverse of focal length). A rectangular aperture 29a having the longitudinal direction along the Z-axis direction and the transverse direction along the X-axis direction is formed in the reticle blind 29. The exposure light EL emitted from the first condenser optical system 28 illuminates the reticle blind 29 in a superimposed manner. The optical element having the power herein refers to an optical element that varies a property of the exposure light EL with incidence of the exposure light EL into the optical element.

A second condenser optical system 30 composed of a lens having a power is provided on the exit side of the reticle blind 29, and the second condenser optical system 30 converts the light incident from the reticle blind 29 side into a nearly parallel beam. On the exit side of the second condenser optical system 30, there is a distribution correction optical system 31 for correction for light intensity distributions at respective points in an illumination region ER1 (cf. FIG. 4A) formed on the reticle R and in a still exposure region ER2 (cf. FIG. 4B) formed on the wafer W in an optically conjugate relation with the illumination region ER1. A specific configuration of the distribution correction optical system 31 will be described later.

The exposure light EL emitted from the distribution correction optical system 31 is incident into an imaging optical system 32. This imaging optical system 32 is provided with an entrance-side lens unit 33, a second reflecting mirror 34 which reflects the exposure light EL emitted from the entrance-side lens unit 33, to the −Z-directional side (the lower side in FIG. 1), and an exit-side lens unit 35 disposed on the exit side of the second reflecting mirror 34. The entrance-side lens unit 33 is composed of at least one optical element (lens) having a power (only one optical element of which is illustrated in FIG. 1) and the exit-side lens unit 35 is composed of at least one optical element (lens) having a power (only one optical element of which is illustrated in FIG. 1). Then the exposure light EL emitted from the imaging optical system 32 illuminates the illumination target surface Ra of the reticle R in a superimposed manner. In the first embodiment, the shape of the aperture 29a of the reticle blind 29 is rectangular as described above. For this reason, the illumination region ER1 on the reticle R and the still exposure region ER2 on the wafer W are formed, as shown in FIGS. 4A and 4B, each in a rectangular shape having the longitudinal direction along the Y-axis direction and the transverse direction along the X-axis direction.

The reticle stage 14 is arranged, as shown in FIG. 1, in such a manner that a mounting surface thereof for the reticle R is approximately perpendicular to the optical-axis direction (Z-axis direction) of the projection optical system 15, on the object plane side of the projection optical system 15. The reticle stage 14 is provided with an unillustrated reticle stage driving unit for moving the reticle R held thereon, in a predetermined stroke in the X-axis direction.

A pupil intensity distribution measuring device 36 is provided near the reticle stage 14. This pupil intensity distribution measuring device 36 is a device that measures a pupil intensity distribution formed by incident beams entering a point in the illumination region ER1 on the reticle R, in the secondary light source 60, for each point (or for each position). The pupil intensity distribution measuring device 36 is provided with a beam splitter 37 for reflecting part of the exposure light EL (the part will also be referred to as "reflected light") emitted from the exit-side lens unit 35 toward the reticle R, a measurement lens 38 into which the reflected light from the beam splitter 37 is incident, and a detection unit 39 into which the reflected light from the measurement lens 38 is incident. This detection unit 39 has a CCD imaging device, a photodiode, or the like and the detection unit 39 outputs a detection signal according to the incident reflected light to a control unit 40. The control unit 40 derives the pupil intensity distribution for each point in the illumination region ER1, based on the detection signal from the detection unit 39. The pupil intensity distribution measuring device 36 is disclosed, for example, in Japanese Patent Application Laid-Open No. 2006-54328 and in U.S. Patent Application Laid-Open No. 2003/0038225.

The projection optical system 15 is provided with a lens barrel 41 filled inside with an inert gas such as nitrogen and a plurality of lenses not shown are provided along the optical path (Z-axis direction) of the exposure light EL in the lens barrel 41. In the lens barrel 41, an aperture stop 42 is arranged at a position in an optical Fourier transform relation with the installation position of the surface Wa of the wafer W and the installation position of the illumination target surface Ra of the reticle R. Then an image of the circuit pattern on the reticle R illuminated with the exposure light EL is projected and transferred to the wafer W on the wafer stage 16, as demagnified at a predetermined reduction ratio through the projection optical system 15. The optical path herein refers to a passage in which the exposure light EL is intended to pass in an operating state.

The wafer stage 16 is provided with a planar mounting surface 43 approximately perpendicular to the optical axis of the projection optical system 15 and the wafer W is mounted on the mounting surface 43. In addition, the wafer stage 16 is provided with an unillustrated wafer stage driving unit for moving the wafer W held thereon, in a predetermined stroke in the X-axis direction. Furthermore, the wafer stage 16 is provided with a mechanism for finely adjusting the position of the wafer W so that the surface Wa of the wafer W becomes perpendicular to the optical axis of the projection optical system 15.

When the image of the pattern is projected onto the wafer W, using the exposure apparatus 11 of the first embodiment, the reticle R is driven by the aforementioned reticle stage driving unit so as to move in the predetermined stroke from the +X-directional side to the −X-directional side (from the near side to the far side with respect to the plane of FIG. 1). Then the illumination region ER1 on the reticle R moves along the direction from the −X-directional side to the +X-directional side (from the far side to the near side with respect to the plane of FIG. 1) of the illumination target surface Ra of the reticle R. Namely, the pattern of the reticle R scans in order from the −X-directional side to the +X-directional side. The wafer W is driven by the aforementioned wafer stage driving unit so as to move at a speed ratio according to the demagnification ratio of the projection optical system 15 from the −X-directional side to the +X-directional side in synchronism with the movement along the X-axis direction of the reticle R. As a result, a pattern of a shape resulting from demagnification of the circuit pattern on the reticle R at the predetermined demagnification ratio is formed in one shot area on the wafer W, with the synchronous movement of the reticle R and the wafer W. After completion of the formation of the pattern in one shot area, the formation of the pattern is sequentially carried out in another shot area on the wafer W.

The optical integrator 26 in the first embodiment will be described below on the basis of FIG. 2. It should be noted that in FIG. 2 the size of each of below-described cylindrical lens faces 52, 53, 54, 55 is exaggeratingly illustrated for convenience' sake of description and understanding of the specification.

Figure 2:
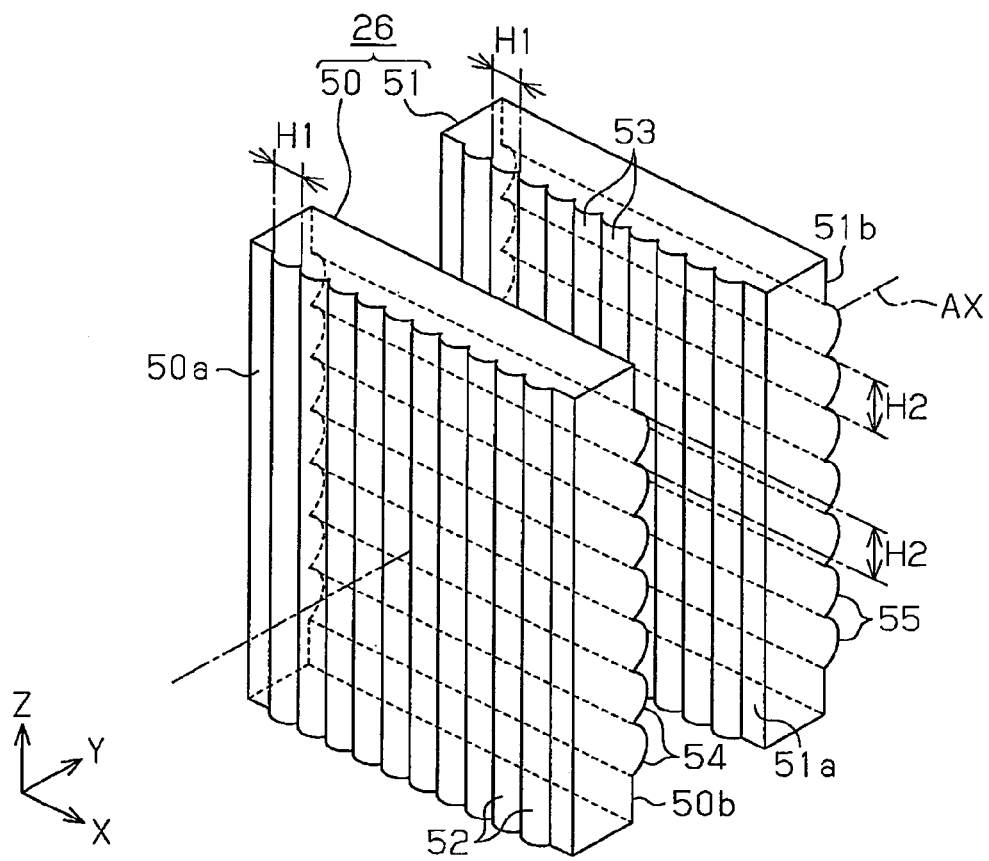
FIG. 2 is an exemplary perspective view schematically showing a pair of micro fly's eye lenses.

As shown in FIG. 2, the optical integrator 26 is provided with a pair of micro fly's eye lenses 50, 51 arranged along the optical axis AX of the illumination optical system 13 (which is indicated by a chain line in FIGS. 1 and 2). These micro fly's eye lenses 50, 51 each are arranged so that the illumination pupil plane 27 located on the exit side of the optical integrator 26 is formed at a position optically conjugate with the aperture stop 42 of the projection optical system 15.

Entrance surfaces 50a, 51a approximately perpendicular to the optical axis AX of the illumination optical system 13 are formed on the entrance side of the first micro fly's eye lens 50 located on the entrance side and on the entrance side of the second micro fly's eye lens 51 located on the exit side, respectively. Furthermore, exit surfaces 50b, 51b approximately perpendicular to the optical axis AX of the illumination optical system 13 are formed on the exit side of the first micro fly's eye lens 50 and on the exit side of the second micro fly's eye lens 51, respectively. A plurality of (ten in FIG. 2) cylindrical lens faces 52, 53 extending in the Z-axis direction are arrayed along the X-axis direction on the entrance surface 50a, 51a side of the two micro fly's eye lenses 50, 51, respectively. Each of these cylindrical lens faces 52, 53 is formed in a shape obtained by cutting off a part of a circular cylinder and a length in the X-axis direction of each cylindrical lens face 52, 53 (i.e., the width) is a first width H1.

A plurality of (ten in FIG. 2) cylindrical lens faces 54, 55 extending in the X-axis direction are arrayed along the Z-axis direction on the exit surface 50b, 51b side of the two micro fly's eye lenses 50, 51, respectively. Each of these cylindrical lens faces 54, 55 is formed in a shape obtained by cutting off a part of a circular cylinder and a length in the Z-axis direction of each cylindrical lens face 54, 55 (i.e., the width) is a second width H2 larger than the first width H1. The first width H1 and the second width H2 each have a correspondence relation with the length in the X-axis direction and the length in the Z-axis direction of the aperture 29a of the reticle blind 29, i.e., with the lengths in the X-axis direction and the lengths in the Y-axis direction of the illumination region ER1 and the still exposure region ER2.

When attention is focused on the refracting action in the X-axis direction of the optical integrator 26, the exposure light EL (i.e., the parallel beam) incident along the optical axis AX of the illumination optical system 13 undergoes wavefront division at intervals of the first width H1 along the X-axis direction by the respective cylindrical lens faces 52 formed in the entrance surface 50a of the first micro fly's eye lens 50. Then beams resulting from the wavefront division by the respective cylindrical lens faces 52 are subjected to focusing action by individually corresponding cylindrical lens faces out of the cylindrical lens faces 53 formed in the entrance surface 51a of the second micro fly's eye lens 51 and thereafter are focused each on the illumination pupil plane 27 located on the exit side of the optical integrator 26. When attention is focused on the refracting action in the Z-axis direction of the optical integrator 26, the exposure light EL (i.e., the parallel beam) incident along the optical axis AX of the illumination optical system 13 undergoes wavefront division at intervals of the second width H2 along the Z-axis direction by the respective cylindrical lens faces 54 formed in the exit surface 50b of the first micro fly's eye lens 50. Then beams resulting from the wavefront division by the respective cylindrical lens faces 54 are subjected to focusing action by individually corresponding cylindrical lens faces out of the cylindrical lens faces 55 formed in the exit surface 51b of the second micro fly's eye lens 51 and thereafter are focused each on the illumination pupil plane 27 located on the exit side of the optical integrator 26.

The first width H1 and the second width H2 of the cylindrical lens faces 52-55 of the micro fly's eye lenses 50, 51 are originally very small. For this reason, the number of wavefront divisions in the optical integrator 26 of the first embodiment is larger than in cases using a fly's eye lens composed of a plurality of lens elements. As a result, a high correlation is exhibited between a global light intensity distribution formed on the entrance side of the optical integrator 26 and a global light intensity distribution of the entire secondary light source formed on the illumination pupil plane 27 on the exit side. Therefore, the light intensity distributions on the entrance side of the optical integrator 26 and on a plane optically conjugate with the entrance side can also be called pupil intensity distributions.

In the case where the diffraction optical element 19 is a diffraction optical element for annular illumination, an illumination field of an annular shape centered on the optical axis AX of the illumination optical system 13 is formed on the entrance side of the optical integrator 26. As a result, the secondary light source 60 of an annular shape, which is the same as the annular illumination field formed on the entrance side, is formed on the illumination pupil plane 27 located on the exit side of the optical integrator 26. In the case where the diffraction optical element 19 is a diffraction optical element for multi-polar illumination, an illumination field of a multi-polar shape consisting of a plurality of illumination zones of a predetermined shape (arcuate, circular, or other shape) centered on the optical axis AX of the illumination optical system 13 is formed on the entrance side of the optical integrator 26. As a result, the secondary light source 60 of a multi-polar shape, which is the same as the multi-polar illumination field formed on the entrance side, is formed on the illumination pupil plane 27 located on the exit side of the optical integrator 26. It is assumed that the first embodiment employs the diffraction optical element 19 for quadrupolar illumination.

Figure 3:
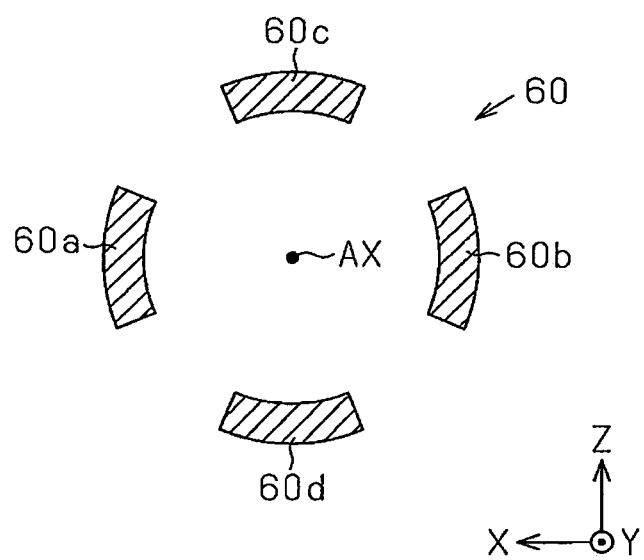
FIG. 3 is an exemplary schematic diagram showing a secondary light source of a quadrupolar shape formed on an illumination pupil plane.

Namely, as shown in FIG. 3, the quadrupolar secondary light source 60 (pupil intensity distribution) consisting of four arcuate substantial surface illuminants (hereinafter referred to simply as "surface illuminants") 60a, 60b, 60c, 60d is formed on the illumination pupil plane 27 located on the exit side of the optical integrator 26. Specifically, the secondary light source 60 has a first surface illuminant 60a of the arcuate shape located on the +X-directional side with respect to the optical axis AX of the illumination optical system 13, and a second surface illuminant 60b of the arcuate shape located on the −X-directional side with respect to the optical axis AX of the illumination optical system 13, and the distance between the first surface illuminant 60a and the optical axis AX is approximately equal to the distance between the second surface illuminant 60b and the optical axis AX. The secondary light source 60 further has a third surface illuminant 60c of the arcuate shape located on the +Z-directional side with respect to the optical axis AX of the illumination optical system 13 and a fourth surface illuminant 60d of the arcuate shape located on the −Z-directional side with respect to the optical axis AX of the illumination optical system 13, and the distance between the third surface illuminant 60c and the optical axis AX is approximately equal to the distance between the fourth surface illuminant 60d and the optical axis AX.

Beams of exposure light EL emitted from the respective surface illuminants 60a-60d are guided onto the reticle R, whereby the illumination region ER1 having the longitudinal direction along the Y-axis direction and the transverse direction along the X-axis direction is formed, as shown in FIG. 4A, on the illumination target surface Ra of the reticle R. The still exposure region ER2 of the rectangular shape corresponding to the illumination region ER1 on the reticle R is formed, as shown in FIG. 4B, on the surface Wa of the wafer W. On this occasion, quadrupolar pupil intensity distributions formed by incident beams incident to respective points in the still exposure region ER2 (and the illumination region ER1) have the same shape, independent of positions of incidence of the exposure light EL. However, light intensities of the quadrupolar pupil intensity distributions at respective points in the still exposure region ER2 (and the illumination region ER1) tend to be different depending on positions of the exposure light EL incident into the still exposure region ER2.

Figure 5:
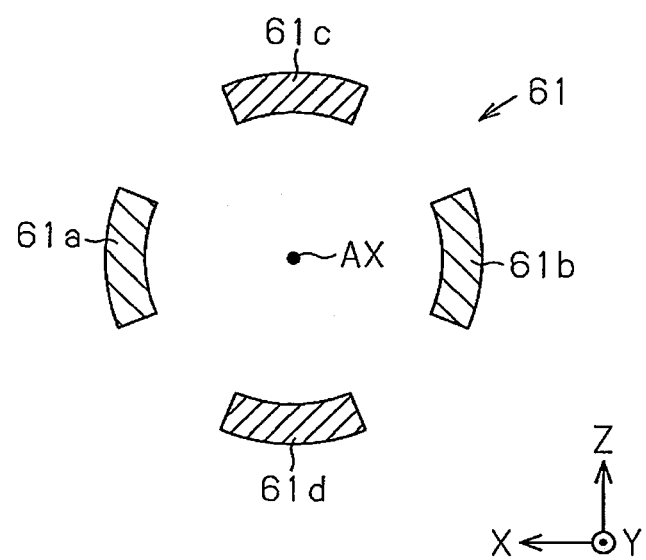
FIG. 5 is an exemplary schematic diagram showing a first pupil intensity distribution formed by incident light beams to enter a center point in the still exposure region.
Figure 6:
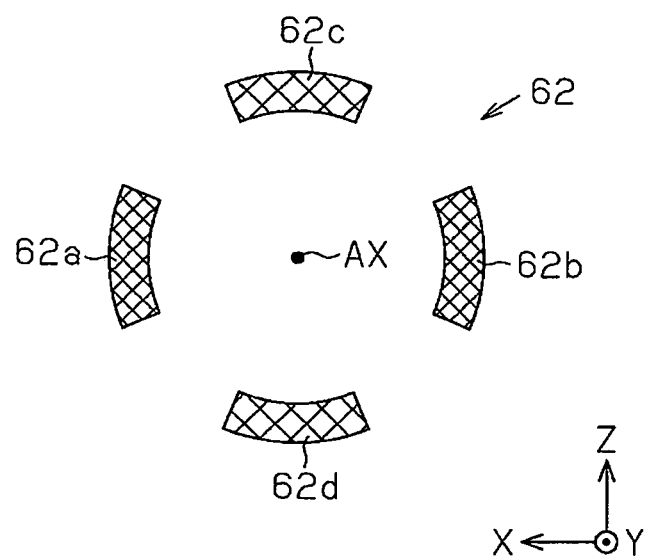
FIG. 6 is an exemplary schematic diagram showing a second pupil intensity distribution formed by incident light beams to enter peripheral points in the still exposure region.

Specifically, in the case of a first pupil intensity distribution 61 formed by first incident light EL1 (cf. FIG. 8) incident to center points P1a, P1b in the Y-axis direction in the illumination region ER1 and in the still exposure region ER2, as shown in FIG. 5, the light intensity of the third surface illuminant 61c and the fourth surface illuminant 61d arranged along the Z-axis direction tends to be stronger than the light intensity of the first surface illuminant 61a and the second surface illuminant 61b arranged along the X-axis direction. On the other hand, in the case of a second pupil intensity distribution 62 formed by second incident light EL2 and third incident light EL3 (cf. FIG. 8) incident to peripheral points P2a, P3a, P2b, P3b spaced along the Y-axis direction with respect to the center points P1a, P1b in the illumination region ER1 and in the still exposure region ER2, as shown in FIGS. 4 (a), 4 (b), and 6, the light intensity of the third surface illuminant 62c and the fourth surface illuminant 62d arranged along the Z-axis direction tends to be weaker than the light intensity of the first surface illuminant 62a and the second surface illuminant 62b arranged along the X-axis direction. The pupil intensity distributions 61, 62 stated herein refer to light intensity distributions corresponding to the respective points P1b, P2b, P3b in the still exposure region ER2, which are formed on the illumination pupil plane 27 and on a pupil conjugate plane optically conjugate with the illumination pupil plane 27 (e.g., a pupil conjugate plane 65 located between the second condenser optical system 30 and the entrance-side lens unit 33 (cf. FIG. 8)), in a state in which the correction filter 24 and below-described transmission filters 66, 67 are not arranged in the optical path of the exposure light EL in the illumination optical system 13.

Figure 7A:
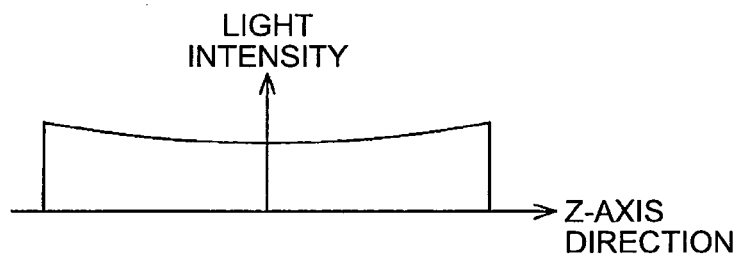
FIG. 7A is an exemplary graph showing light intensities along the Z-axis direction of the first pupil intensity distribution corresponding to the center point in the still exposure region and FIG. 7B is an exemplary graph showing light intensities along the Z-axis direction of the second pupil intensity distribution corresponding to the peripheral points in the still exposure region.
Figure 7B:
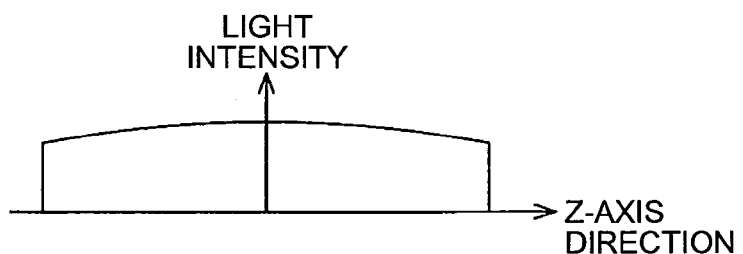

In general, a light intensity profile along the Z-axis direction of the first pupil intensity distribution 61 corresponding to the center points P1a, P1b is, as shown in FIG. 7A, a concave curved profile in which the light intensity is the weakest at the center in the Z-axis direction and gradually increases with distance from the center along the Z-axis direction. A light intensity profile along the Z-axis direction of the second pupil intensity distribution 62 corresponding to each peripheral point P2a, P2b, P3a, P3b is, as shown in FIG. 7, a convex curved profile in which the light intensity is the strongest at the center in the Z-axis direction and gradually decreases with distance from the center along the Z-axis direction.

Such light intensity profiles along the Z-axis direction of the pupil intensity distributions 61, 62 have little dependence on positions of respective points along the X-axis direction in the illumination region ER1 and the still exposure region ER2, but tend to vary depending upon positions of respective points along the Y-axis direction in the illumination region ER1 and the still exposure region ER2. For this reason, when the pupil intensity distributions 61, 62 individually corresponding to the respective points P1b, P2b, P3b along the Y-axis direction in the still exposure region ER2 are not uniform, there is a risk of occurrence of variation in the line width of the pattern formed on the wafer W. For solving this problem, the correction filter 24 and distribution correction optical system 31 are provided in the illumination optical system 13 of the first embodiment.

The correction filter 24 in the first embodiment has a transmittance distribution to cause extinction of beams forming the third surface illuminant 60c and the fourth surface illuminant 60d along the Z-axis direction of the secondary light source 60 formed on the illumination pupil plane 27 and to cause little extinction of beams forming the first surface illuminant 60a and the second surface illuminant 60b along the X-axis direction.

Figure 8:
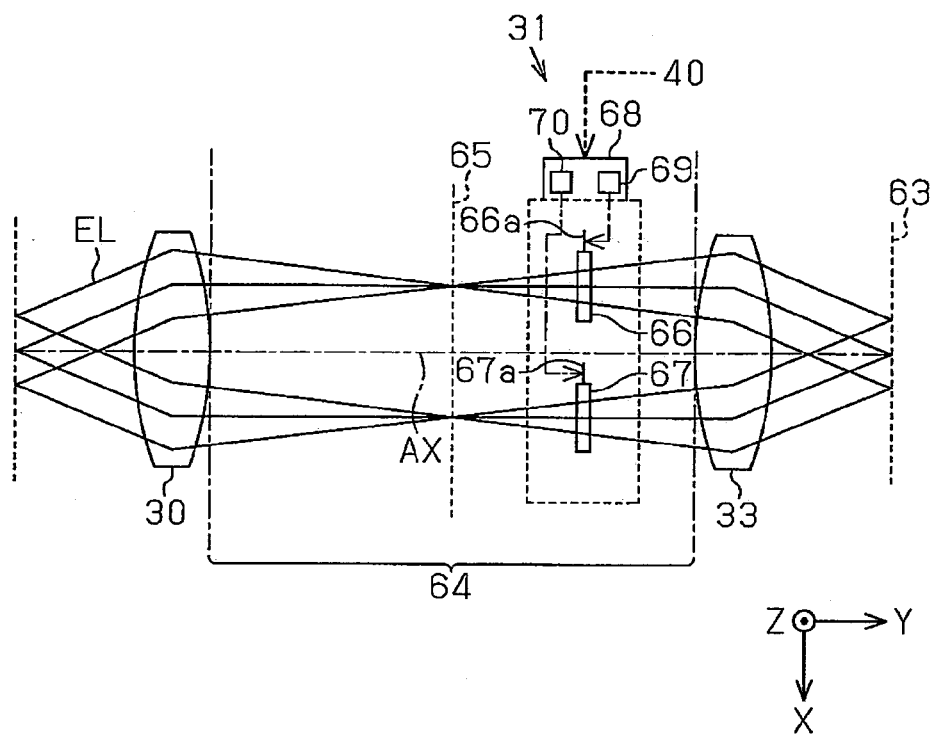
FIG. 8 is an exemplary schematic configuration diagram showing a distribution correction optical system in the first embodiment.
Figure 9:
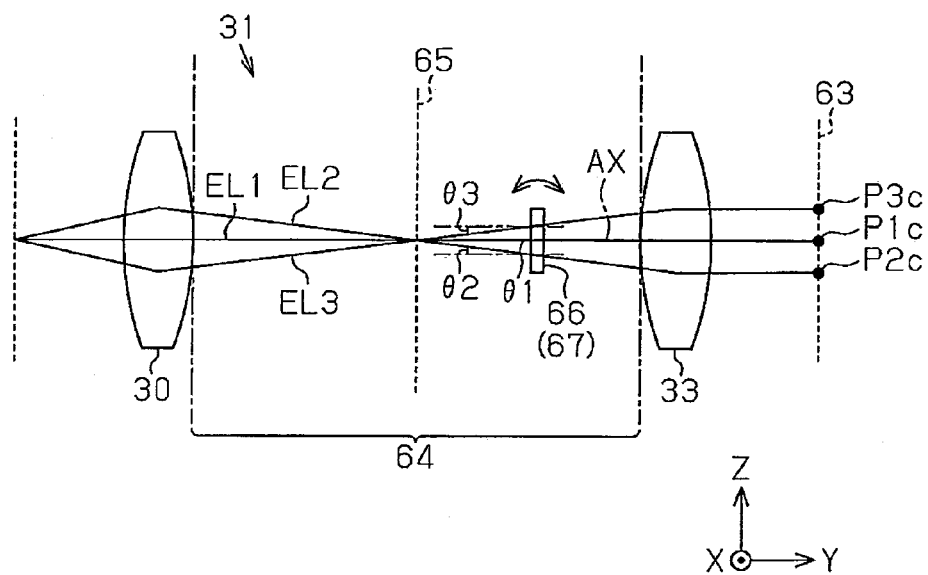
FIG. 9 is an exemplary schematic configuration diagram of the distribution correction optical system when viewed from a direction different from that in FIG. 8.

Next, the distribution correction optical system 31 in the first embodiment will be described on the basis of FIGS. 8 to 10. It is noted that FIG. 8 shows only beams of the exposure light EL emitted from the first surface illuminant 60a and the second surface illuminant 60b out of the surface illuminants 60a-60d constituting the secondary light source 60. In FIG. 9, a conjugate center point P1c corresponding to the center point P1b in the still exposure region ER2, and conjugate peripheral points P2c, P3c individually corresponding to the respective peripheral points P2b, P3b are shown at an image-plane conjugate position 63 (the position indicated by a dashed line in FIGS. 8 and 9) optically conjugate with the surface Wa of the wafer W.

As shown in FIG. 8, the distribution correction optical system 31 is provided with a plurality of (two in the first embodiment) transmission filters 66, 67 arranged in an adjustment region 64 formed between the second condenser optical system 30 and the entrance-side lens unit 33 and on the exit side of the pupil conjugate plane 65 optically conjugate with the illumination pupil plane 27. These transmission filters 66, 67, as shown in FIG. 9, are arranged each along the X-axis direction perpendicular to the Y-axis direction being the optical-axis direction of the illumination optical system 13. The first transmission filter 66 out of the transmission filters 66, 67 is arranged in the optical path of the exposure light EL emitted from the first surface illuminant 60a corresponding to the first region of the secondary light source 60 formed on the illumination pupil plane 27. The second transmission filter 67 is arranged in the optical path of the exposure light EL emitted from the second surface illuminant 60b corresponding to the second region different from the first region in the illumination pupil plane 27.

Each of the transmission filters 66, 67 is provided with a predetermined rotation axis 66a or 67a, respectively, extending along the X-axis direction, and each transmission filter 66, 67 is rotatable around an axis on the rotation axis 66a or 67a. Each of the transmission filters 66, 67 has a transmittance characteristic varying according to angles of incidence θ of the exposure light EL, as shown in FIG. 10. Specifically, each transmission filter 66, 67 has the highest transmittance when the exposure light EL is incident at the incidence angle θ of "0°." On the other hand, each transmission filter 66, 67 gradually decreases its transmittance as the absolute value of the incidence angle θ of the exposure light EL incident into each transmission filter 66, 67 increases from "0." Each transmission filter 66, 67 is constructed by forming on a glass plate a film designed so as to minimize variation in degree of polarization according to the incidence angles θ of light.

The distribution correction optical system 31 is provided with a rotation mechanism 68 for individually rotating each of the transmission filters 66, 67. This rotation mechanism 68 is provided with a first drive source 69 for driving the first transmission filter 66 so as to rotate it, and a second drive source 70 for driving the second transmission filter 67 so as to rotate it. Each of these drive sources 69, 70 is arranged to drive the filter in accordance with a control command from the control unit 40. Furthermore, the distribution correction optical system 31 is provided with an unillustrated reciprocal movement device for reciprocally moving each transmission filter 66, 67 between two positions inside and outside the optical path of the exposure light EL and the reciprocal movement device is arranged to drive the filter in accordance with a control command from the control unit 40.

The control unit 40 in the first embodiment calculates each of pupil intensity distributions in the secondary light source 60 corresponding to the respective points along the Y-axis direction in the still exposure region ER2 on the wafer W, based on detection signals from the pupil intensity distribution measuring device 36. Then the control unit 40 individually controls degrees of rotation of the respective transmission filters 66, 67 so as to approximately equalize the pupil intensity distributions corresponding to the respective points along the Y-axis direction in the still exposure region ER2.

The below will describe an example of action in adjustment of the pupil intensity distributions 61, 62 corresponding to the respective points P1b, P2b, P3b along the Y-axis direction in the still exposure region ER2. It is assumed that in an initial state the transmission filters 66, 67 are located each outside the optical path of the exposure light EL.

When the exposure light EL emitted from the light source device 12 is incident into the diffraction optical element 19, the diffraction optical element 19 emits the exposure light EL of the quadrupolar sectional shape. Then the exposure light EL passes through the correction filter 24 arranged at or near the position optically conjugate with the illumination pupil plane 27, whereby the secondary light source 60 having the first surface illuminant 60a and the second surface illuminant 60b undergoing little correction by the correction filter 24 and the third surface illuminant 60c and the fourth surface illuminant 60d undergoing correction (extinction) by the correction filter 24 is formed on the illumination pupil plane 27 formed on the exit side of the optical integrator 26. On this occasion, the correction filter 24 also corrects the pupil intensity distribution on the pupil conjugate plane optically conjugate with the illumination pupil plane 27 (e.g., the pupil conjugate plane 65 located between the second condenser optical system 30 and the imaging optical system 32).

The correction filter 24 in the first embodiment is a filter for reducing the light intensity of the third surface illuminant 60c and the fourth surface illuminant 60d along the Z-axis direction of the secondary light source 60 formed on the illumination pupil plane 27. In the first pupil intensity distribution 61 corresponding to the center points P1a, P1b in the illumination region ER1 on the reticle R and in the still exposure region ER2 on the wafer W, as described above, when the correction filter 24 is not located in the optical path of the exposure light EL, the light intensity of each of the first surface illuminant 61a and the second surface illuminant 61b along the X-axis direction is weaker than the light intensity of each of the third surface illuminant 61c and the fourth surface illuminant 61d along the Z-axis direction. In the first pupil intensity distribution 61, therefore, the correction filter 24 makes the light intensity of each of the third surface illuminant 61c and the fourth surface illuminant 61d almost equal to the light intensity of each of the first surface illuminant 61a and the second surface illuminant 61b. On the other hand, in the second pupil intensity distribution 62 corresponding to the peripheral points P2a, P2b, P3a, P3b in the illumination region ER1 and in the still exposure region ER2, when the correction filter 24 is not located in the optical path of the exposure light EL, the light intensity of each of the first surface illuminant 62a and the second surface illuminant 62b along the X-axis direction is stronger than the light intensity of each of the third surface illuminant 62c and the fourth surface illuminant 62d along the Z-axis direction. In the second pupil intensity distribution 62, therefore, the correction filter 24 increases the difference between the light intensity of each of the first surface illuminant 61a and the second surface illuminant 62b and the light intensity of each of the third surface illuminant 62c and the fourth surface illuminant 62d on the contrary.

For adjusting such first pupil intensity distribution 61 and second pupil intensity distribution 62 to distributions with almost identical properties, it is necessary to implement slight reduction of the light intensity of the first surface illuminant 61a and the second surface illuminant 61b of the first pupil intensity distribution 61 and to implement considerable reduction of the light intensity of the first surface illuminant 62a and the second surface illuminant 62b of the second pupil intensity distribution 62. In the first embodiment, therefore, the pupil intensity distribution measuring device 36 measures each of light intensities of quadrupolar pupil intensity distributions for respective points in the still exposure region ER2 in the secondary light source 60 formed on the illumination pupil plane 27. In this example, the pupil intensity distribution measuring device 36 measures each of the first pupil intensity distribution 61 and the second pupil intensity distribution 62 formed on the illumination pupil plane 27 by the incident beams EL1, EL2, EL3 to enter the center point P1$b$, and the peripheral points P2$b$, P3$b$ in the still exposure region ER2. In this case, the first pupil intensity distribution 61 and the second pupil intensity distribution 62 have mutually different properties. For this reason, through the drive of the unillustrated reciprocal movement device, the transmission filters 66, 67 are located in the optical path of the exposure light EL emitted from the first surface illuminant 60$a$ of the secondary light source 60 and in the optical path of the exposure light EL emitted from the second surface illuminant 60$b$, respectively.

With rotation of each transmission filter 66, 67, each of properties of the respective pupil intensity distributions 61, 62 measured by the pupil intensity distribution measuring device 36 varies according to a state of rotation of each transmission filter 66, 67. When the first incident beam EL1 to enter the center point P1$b$ of the still exposure region ER2 has the first incidence angle θ1 of "0°" relative to each transmission filter 66, 67, the second incident beam EL2 and the third incident beam EL3 to enter the respective peripheral points P2$b$, P3$b$ in the still exposure region ER2 have the respective incidence angles θ2, θ3 different from the incidence angle of "0°" relative to each transmission filter 66, 67. On this occasion, the second incidence angle θ2 of the second incident beam EL2 relative to each transmission filter 66, 67 is a value resulting from multiplication of "−1" by the third incidence angle θ3 of the third incident beam EL3 relative to each transmission filter 66, 67. For this reason, the transmittance for the second incident beam EL2 to pass through each transmission filter 66 is approximately equal to the transmittance for the third incident beam EL3 to pass through each transmission filter 66 (cf. FIG. 10).

Then, the first incident beams EL1 to enter the center point P1$b$ in the still exposure region ER2, out of the beams of exposure light EL emitted from the first surface illuminant 60$a$ and the second surface illuminant 60$b$ of the secondary light source 60 are subjected to little extinction by the transmission filters 66, 67. On the other hand, the second incident beams EL2 and the third incident beams EL3 to enter the peripheral points P2$b$, P3$b$ in the still exposure region ER2, out of the beams of exposure light EL emitted from the first surface illuminant 60$a$ and the second surface illuminant 60$b$ of the secondary light source 60, are subjected to great extinction by the transmission filters 66, 67. In other words, the light intensity of the first surface illuminant 61$a$ and the second surface illuminant 61$b$ of the first pupil intensity distribution 61 corresponding to the center point P1$b$ is a little reduced by the transmission filters 66, 67, while the light intensity of the first surface illuminant 62$a$ and the second surface illuminant 62$b$ of the second pupil intensity distribution 62 corresponding to the peripheral points P2$b$, P3$b$ is largely reduced by the transmission filters 66, 67.

By rotating each of the transmission filters 66, as described above, the property of the first pupil intensity distribution 61 becomes almost equal to the property of the second pupil intensity distribution 62. Namely, the light intensity of the first incident beams EL1 incident to the center point P1$b$ of the still exposure region ER2 from the respective surface illuminants 61$a$-61$d$ becomes substantially equal to the light intensity of the second incident beams EL2 and the third incident beams EL3 incident to each of the peripheral points P2$b$, P3$b$ of the still exposure region ER2 from the respective surface illuminants 62$a$-62$d$. For this reason, when an exposure process is executed in this state, occurrence of variation in the line width of the pattern formed on the surface Wa of the wafer W is suppressed because the pupil intensity distributions 61, 62 corresponding to the points P1$b$, P2$b$, P3$b$ along the Y-axis direction in the still exposure region ER2 on the wafer W have almost identical properties.

In the first embodiment, individual rotation of each transmission filter 66, 67 results in individually adjusting the light intensity of the first surface illuminants 61$a$, 62$b$ and the light intensity of the second surface illuminants 61$b$, 62$b$ in the respective pupil intensity distributions 61, 62. For this reason, the properties of the respective pupil intensity distributions 61, 62 corresponding to the respective points P1$b$, P2$b$, P3$b$ in the still exposure region ER2 are adjusted in more detail than in the case where only one transmission filter is arranged in the optical path of the exposure light EL.

Therefore, the first embodiment can achieve the effects described below.

(1) The first transmission filter 66 is disposed in the optical path of the exposure light EL emitted from the first surface illuminant 60$a$ of the secondary light source 60 formed on the illumination pupil plane 27 located on the exit side of the optical integrator 26, and the second transmission filter 67 is disposed in the optical path of the exposure light EL emitted from the second surface illuminant 60$b$. Then the light intensities upon illumination on the illumination target surface Ra of the reticle R and on the surface Wa of the wafer W with the exposure light EL emitted from the first surface illuminant 60$a$ and the second surface illuminant 60$b$ are adjusted each by rotating the transmission filters 66, 67, respectively. Namely, the pupil intensity distributions 61, 62 corresponding to the points P1$b$, P2$b$, P3$b$ in the still exposure region ER2 formed on the wafer W are independently adjusted by individual rotation of the transmission filters 66, 67. Therefore, the pupil intensity distributions 61, 62 corresponding to the points P1$b$, P2$b$, P3$b$ in the still exposure region ER2 can be adjusted in greater detail than, for example, in the case where only one transmission filter is arranged in the optical path of the exposure light EL. Therefore, the pupil intensity distributions 61, 62 corresponding to the respective points P1$b$, P2$b$, P3$b$ in the still exposure region ER2 on the wafer W can be adjusted to distributions with properties substantially identical to each other.

(2) In the first embodiment, the correction filter 24 for equally adjusting the pupil intensity distributions 61, 62 corresponding to the respective points P1$b$, P2$b$, P3$b$ in the still exposure region ER2 on the wafer W is provided at the position optically conjugate with the surface Wa of the wafer W, on the light source device 12 side with respect to the optical integrator 26. Then the pupil intensity distributions 61, 62 corresponding to the respective points P1$b$, P2$b$, P3$b$ in the still exposure region ER2 are adjusted so as to be substantially uniform, by the cooperative action of the correction filter 24 and the transmission filters 66, 67. For this reason, the pupil intensity distributions 61, 62 corresponding to the respective points P1$b$, P2$b$, P3$b$ in the still exposure region ER2 can be adjusted in higher precision than in the case where the correction filter 24 is not located in the optical path of the exposure light EL. Therefore, the exposure process for the wafer W can be performed under an appropriate illumination condition according to the circuit pattern of the reticle R and, as a result, the pattern can be faithfully formed in a desired line width across the entire area on the wafer W.

(3) In the first embodiment, each of the transmission filters 66, 67 is rotated based on the measurement results calculated based on the detection signals from the pupil intensity distribution measuring device 36, i.e., based on the pupil intensity distributions 61, 62 corresponding to the respective points P1a, P2a, P3a in the illumination region ER1 on the reticle R. For this reason, if there is a change in the pupil intensity distributions 61, 62 due to deterioration of at least one optical element out of the various optical elements forming the illumination optical system 13, the pupil intensity distributions 61, 62 can be quickly adjusted to distributions with desired properties, by rotating each of the transmission filters 66, 67 on the basis of the measurement results by the pupil intensity distribution measuring device 36.

(4) Each of the transmission filters 66, 67 is arranged near the pupil conjugate plane 65 optically conjugate with the illumination pupil plane 27 (i.e., in the adjustment region 64). For this reason, the pupil intensity distributions 61, 62 corresponding to the respective points P1b, P2b, P3b in the still exposure region ER2 can be adjusted to distributions with desired properties, by rotating each of the transmission filters 66, 67.

Second Embodiment

The second embodiment will be described below on the basis of FIGS. 12 to 17. In the second embodiment, the Z-axis direction is defined along the optical axis of the below-described projection optical system 15 (the vertical direction in FIG. 12), the Y-axis direction along the horizontal direction in FIG. 12, and the X-axis direction along a direction perpendicular to the plane of FIG. 12.

Figure 12:
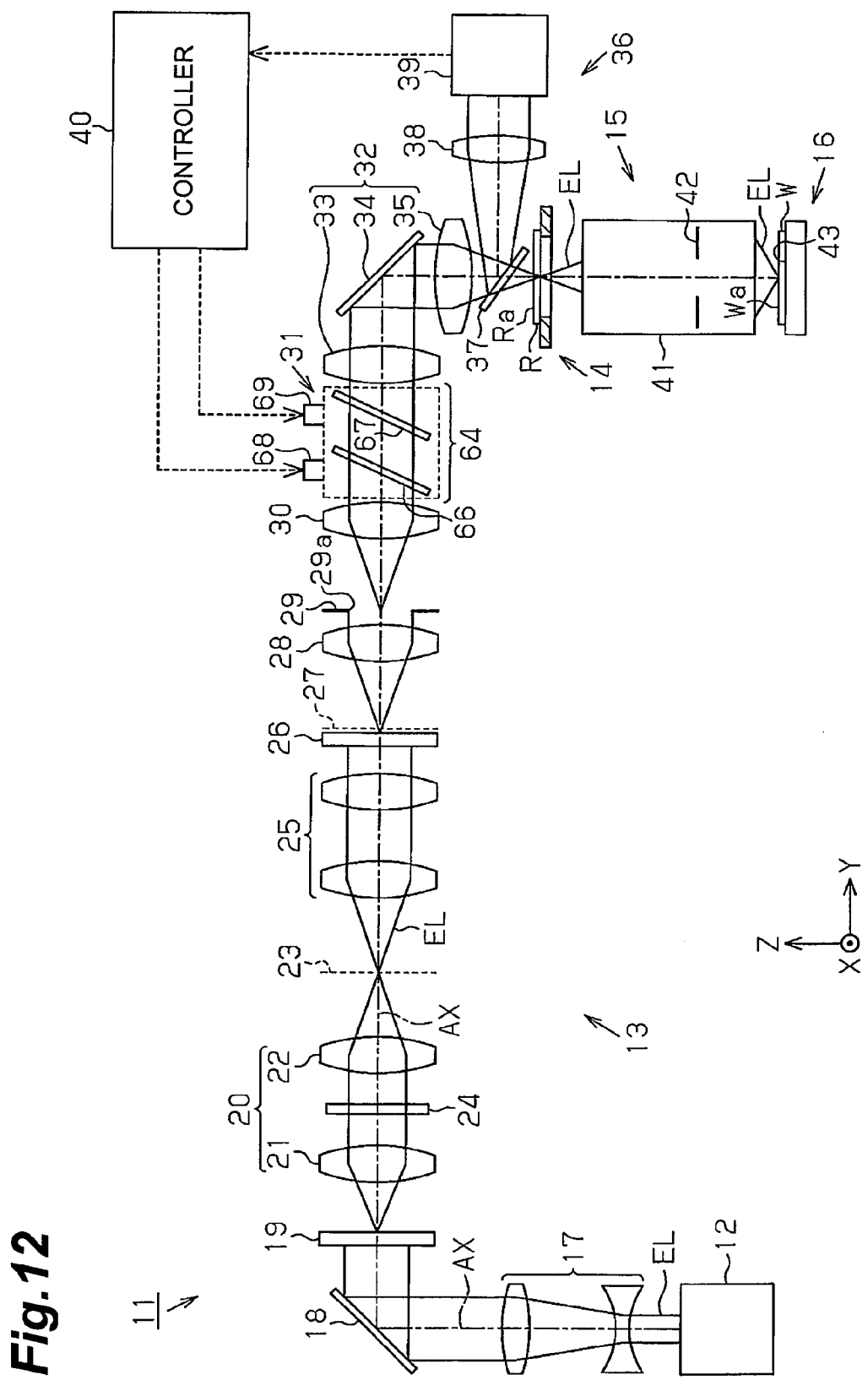
FIG. 12 is an exemplary schematic configuration diagram showing an exposure apparatus in the second embodiment.

As shown in FIG. 12, the exposure apparatus 11 of the second embodiment is a device for projecting an image of a circuit pattern onto a wafer W a surface Wa (the surface on the +Z-directional side and the top surface in FIG. 12) of which is coated with a photosensitive material such as a resist, while a transmission type reticle R with the predetermined circuit pattern formed thereon is illuminated with exposure light EL. The exposure apparatus 11 is provided with the illumination optical system 13 for guiding the exposure light EL emitted from the light source device 12, to the illumination target surface Ra (the surface on the +Z-directional side) of the reticle R, the reticle stage 14 holding the reticle R, the projection optical system 15 for guiding the exposure light EL passing through the reticle R to the surface Wa of the wafer W, and the wafer stage 16 holding the wafer W. The light source device 12 in the second embodiment has an ArF excimer laser light source to output light at the wavelength of 193 nm and the light emitted from the ArF excimer laser light source is guided as the exposure light EL into the exposure apparatus 11.

The illumination optical system 13 is provided with the shaping optical system 17 for converting the exposure light EL emitted from the light source device 12, into a parallel beam of a predetermined sectional shape (e.g., a nearly rectangular cross section), and the first reflecting mirror 18 which reflects the exposure light EL emitted from the shaping optical system 17, to the reticle R side (the +Y-directional side and the right side in FIG. 12). The diffraction optical element 19 is provided on the exit side (reticle R side) of this first reflecting mirror 18. This diffraction optical element 19 is constructed by forming a plurality of blocks having the pitch nearly equal to the wavelength of the exposure light EL, in a glass substrate and has an action to diffract the exposure light EL entering from the entrance side (light source device 12 side), at predetermined angles. For example, in a case where the diffraction optical element 19 is one for circular illumination, when the exposure light EL is incident as a parallel beam of a nearly rectangular cross section from the entrance side into the diffraction optical element 19, the diffraction optical element 19 emits a beam of a circular sectional shape to the reticle R side. In a case where the diffraction optical element 19 is one for multi-polar (dipolar, quadrupolar, octupolar, or other) illumination, when the exposure light EL is incident as a parallel beam of a nearly rectangular cross section from the entrance side into the diffraction optical element 19, the diffraction optical element 19 emits a plurality of (e.g., four) beams according to the number of poles, to the reticle R side.

The illumination optical system 13 is provided with the afocal optical system 20 into which the exposure light EL emitted from the diffraction optical element 19 is incident (which is also called "afocal optic"). This afocal optical system 20 has the first lens unit 21 (only one lens of which is illustrated in FIG. 12), and the second lens unit 22 disposed on the exit side with respect to the first lens unit 21 (only one lens of which is illustrated in FIG. 12). The afocal optical system 20 is formed in such a manner that the entrance-side focal position of the afocal optical system 20 is approximately coincident with the installation position of the diffraction optical element 19 and that the exit-side focal position of the afocal optical system 20 is approximately coincident with the position of the predetermined plane 23 indicated by a dashed line in FIG. 12.

In the optical path between the first lens unit 21 and the second lens unit 22, the correction filter 24 having a transmittance distribution of different transmittances according to positions of incidence of the exposure light EL is provided at or near a position optically conjugate with the illumination pupil plane 27 of the below-described optical integrator 26. This correction filter 24 is a filter obtained by forming a pattern of light-blocking dots comprised of chromium or chromium oxide on a glass substrate having an entrance plane and an exit plane parallel to each other.

The zoom optical system 25 for varying the σ value (σ value=numerical aperture on the reticle R side of the illumination optical system 13/numerical aperture on the reticle R side of the projection optical system 15) is provided on the reticle R side of the afocal optical system 20 and the zoom optical system 25 is arranged on the exit side with respect to the predetermined plane 23. The exposure light EL to be emitted from the zoom optical system 25 is converted into a parallel beam by the zoom optical system 25 and thereafter the parallel beam is incident into the optical integrator 26 arranged on the exit side of the zoom optical system 25. Then the optical integrator 26 divides the wavefront of the incident exposure light EL into a plurality of beams and forms a predetermined light intensity distribution (also referred to as "pupil intensity distribution") on the illumination pupil plane 27 located on the exit side (+Y-directional side) thereof. The illumination pupil plane 27 on which the pupil intensity distribution is formed is also referred to as a secondary light source 60 consisting of at least one surface illuminant (cf. FIG. 13).

The optical integrator 26 is arranged in such a manner that an entrance plane thereof (a plane on the −Y-directional side and the left plane in FIG. 12) is located at or near the exit-side focal position (also referred to as a pupil plane) of the zoom optical system 25. Namely, the zoom optical system 25 is arranged at the position so as to keep the predetermined plane 23 and the entrance plane of the optical integrator 26 in a substantial Fourier transform relation and so as to keep the pupil plane of the afocal optical system 20 (i.e., the installation position of the correction filter 24) and the entrance plane of the optical integrator 26 substantially optically conjugate with each other.

On the exit side of the optical integrator 26, there is an unshown illumination aperture stop, which is arranged at a position substantially optically conjugate with the entrance pupil plane of the projection optical system 15 and which is provided for defining a range of contribution of the secondary light source 60 to illumination. This illumination aperture stop has a plurality of aperture portions of different sizes and shapes. In the illumination aperture stop, an aperture portion corresponding to the cross-sectional shape of the exposure light EL emitted from the secondary light source 60 is located in the optical path of the exposure light EL. Specifically, in a case where the cross-sectional shape of the exposure light EL emitted from the secondary light source 60 is circular, the illumination aperture stop is driven so as to locate the aperture portion of the shape corresponding to the circular shape in the optical path of the exposure light EL.

On the exit side of the optical integrator 26 and the illumination aperture stop, there are the first condenser optical system 28 composed of at least one lens (only one lens of which is illustrated in FIG. 12), and the reticle blind 29 (also referred to as "mask blind") arranged on the exit side of the first condenser optical system 28 and at a position optically conjugate with the illumination pupil plane 27. The first condenser optical system 28 is composed of an optical element (lens) having a power (inverse of focal length). The rectangular aperture 29a having the longitudinal direction along the Z-axis direction and the transverse direction along the X-axis direction is formed in the reticle blind 29. The exposure light EL emitted from the first condenser optical system 28 illuminates the reticle blind 29 in a superimposed manner. The optical element having the power herein refers to an optical element that varies a property of the exposure light EL with incidence of the exposure light EL into the optical element.

The second condenser optical system 30 composed of a lens having a power is provided on the exit side of the reticle blind 29, and the second condenser optical system 30 converts the light incident from the reticle blind 29 side into a nearly parallel beam. On the exit side of the second condenser optical system 30, there is the distribution correction optical system 31 for correction for light intensity distributions at respective points in the illumination region ER1 (cf. FIG. 4A in the first embodiment) formed on the reticle R and in the still exposure region ER2 (cf. FIG. 4B in the first embodiment) formed on the wafer W in an optically conjugate relation with the illumination region ER1. A specific configuration of the distribution correction optical system 31 will be described later.

The exposure light EL emitted from the distribution correction optical system 31 is incident into the imaging optical system 32. This imaging optical system 32 is provided with the entrance-side lens unit 33, the second reflecting mirror 34 which reflects the exposure light EL emitted from the entrance-side lens unit 33, to the −Z-directional side (the lower side in FIG. 12), and the exit-side lens unit 35 disposed on the exit side of the second reflecting mirror 34. The entrance-side lens unit 33 is composed of at least one optical element (lens) having a power (only one optical element of which is illustrated in FIG. 12) and the exit-side lens unit 35 is composed of at least one optical element (lens) having a power (only one optical element of which is illustrated in FIG. 12). Then the exposure light EL emitted from the imaging optical system 32 illuminates the illumination target surface Ra of the reticle R in a superimposed manner. In the second embodiment, the shape of the aperture 29a of the reticle blind 29 is rectangular as described above. For this reason, the illumination region ER1 on the reticle R and the still exposure region ER2 on the wafer W are formed, as shown in FIGS. 4A and 4B in the first embodiment, each in a rectangular shape having the longitudinal direction along the Y-axis direction and the transverse direction along the X-axis direction.

The reticle stage 14 is arranged, as shown in FIG. 12, in such a manner that a mounting surface thereof for the reticle R is approximately perpendicular to the optical-axis direction (Z-axis direction) of the projection optical system 15, on the object plane side of the projection optical system 15. The reticle stage 14 is provided with an unillustrated reticle stage driving unit for moving the reticle R held thereon, in a predetermined stroke in the X-axis direction.

The pupil intensity distribution measuring device 36 is provided near the reticle stage 14. This pupil intensity distribution measuring device 36 is a device that measures a pupil intensity distribution formed by incident beams entering a point in the illumination region ER1 on the reticle R, in the secondary light source 60, for each point (or for each position). The pupil intensity distribution measuring device 36 is provided with the beam splitter 37 for reflecting part of the exposure light EL (the part will also be referred to as "reflected light") emitted from the exit-side lens unit 35 toward the reticle R, the measurement lens 38 into which the reflected light from the beam splitter 37 is incident, and the detection unit 39 into which the reflected light from the measurement lens 38 is incident. This detection unit 39 has a CCD imaging device, a photodiode, or the like and the detection unit 39 outputs a detection signal according to the incident reflected light to the control unit 40. The pupil intensity distribution measuring device 36 is disclosed, for example, in Japanese Patent Application Laid-Open No. 2006-54328 and in U.S. Patent Application Laid-Open No. 2003/0038225.

The projection optical system 15 is provided with the lens barrel 41 filled inside with an inert gas such as nitrogen and a plurality of lenses not shown are provided along the optical path (Z-axis direction) of the exposure light EL in the lens barrel 41. In the lens barrel 41, the aperture stop 42 is arranged at a position in an optical Fourier transform relation with the installation position of the surface Wa of the wafer W and the installation position of the illumination target surface Ra of the reticle R. Then an image of the circuit pattern on the reticle R illuminated with the exposure light EL is projected and transferred to the wafer W on the wafer stage 16, as demagnified at a predetermined reduction ratio through the projection optical system 15. The optical path herein refers to a passage in which the exposure light EL is intended to pass in an operating state.

The wafer stage 16 is provided with the planar mounting surface 43 approximately perpendicular to the optical axis of the projection optical system 15 and the wafer W is mounted on the mounting surface 43. In addition, the wafer stage 16 is provided with an unillustrated wafer stage driving unit for moving the wafer W held thereon, in a predetermined stroke in the X-axis direction. Furthermore, the wafer stage 16 is provided with a mechanism for finely adjusting the position of the wafer W so that the surface Wa of the wafer W becomes perpendicular to the optical axis of the projection optical system 15.

When the image of the pattern is projected onto the wafer W, using the exposure apparatus 11 of the second embodiment, the reticle R is driven by the aforementioned reticle stage driving unit so as to move in the predetermined stroke from the +X-directional side to the −X-directional side (from the near side to the far side with respect to the plane of FIG. 12). Then the illumination region ER1 on the reticle R moves along the direction from the −X-directional side to the +X-directional side (from the far side to the near side with respect to the plane of FIG. 12) of the illumination target surface Ra of the reticle R. Namely, the pattern of the reticle R scans in order from the −X-directional side to the +X-directional side. The wafer W is driven by the aforementioned wafer stage driving unit so as to move at a speed ratio according the demagnification ratio of the projection optical system 15 from the −X-directional side to the +X-directional side in synchronism with the movement along the X-axis direction of the reticle R. As a result, a pattern of a shape resulting from demagnification of the circuit pattern on the reticle R at the predetermined demagnification ratio is formed in one shot area on the wafer W, with the synchronous movement of the reticle R and the wafer W. After completion of the formation of the pattern in one shot area, the formation of the pattern is sequentially carried out in another shot area on the wafer W.

Figure 13:
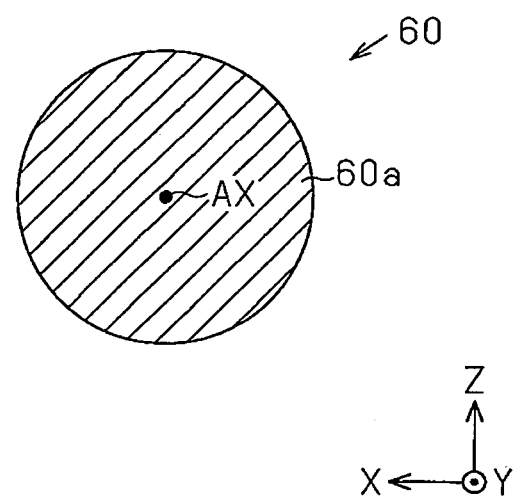
FIG. 13 is an exemplary schematic diagram showing a secondary light source of a circular shape formed on an illumination pupil plane.

Next, the optical integrator 26 in the second embodiment is the same as that in the first embodiment. However, since the second embodiment employs the diffraction optical element for circular illumination as the diffraction optical element 19, an illumination field of a circular shape centered on the optical axis AX of the illumination optical system 13 is formed on the entrance side of the optical integrator 26. As a result, the secondary light source 60 of the circular shape, which is the same as the circular illumination field formed on the entrance side, is formed on the illumination pupil plane 27 located on the exit side of the optical integrator 26. For this reason, the secondary light source 60 (pupil intensity distribution) having a substantial surface illuminant of the circular shape (hereinafter referred to simply as "surface illuminant") 60a is formed, as shown in FIG. 13, on the illumination pupil plane 27 located on the exit side of the optical integrator 26.

When the exposure light EL emitted from the secondary light source 60 of this shape (i.e., the surface illuminant 60a) is guided onto the reticle R, the illumination region ER1 of the rectangular shape having the longitudinal direction along the Y-axis direction and the transverse direction along the X-axis direction is formed, as shown in FIG. 4A, on the illumination target surface Ra of the reticle R. The still exposure region ER2 of the rectangular shape corresponding to the illumination region ER1 on the reticle R is formed, as shown in FIG. 4B, on the surface Wa of the wafer W. Namely, the first incident light EL1 (cf. FIGS. 15A and 15B) entering the center point P1a in the Y-axis direction in the illumination region ER1 travels through the projection optical system 15 to enter the center point P1b in the Y-axis direction in the still exposure region ER2. The second incident light EL2 and the third incident light EL3 (cf. FIGS. 15A and 15B) entering the respective peripheral points P2a, P3a located at both ends in the Y-axis direction in the illumination region ER1 travels through the projection optical system 15 to enter the peripheral points P2b, P3b, respectively, in the Y-axis direction in the still exposure region ER2. In this case, each of the circular pupil intensity distributions formed by the incident beams EL1-EL3 to enter the respective points P1b-P3b (P1a-P3a) in the still exposure region ER2 (and the illumination region ER1) has much the same shape (i.e., the circular shape), independent of the positions of incidence of the exposure light EL.

Figure 14:
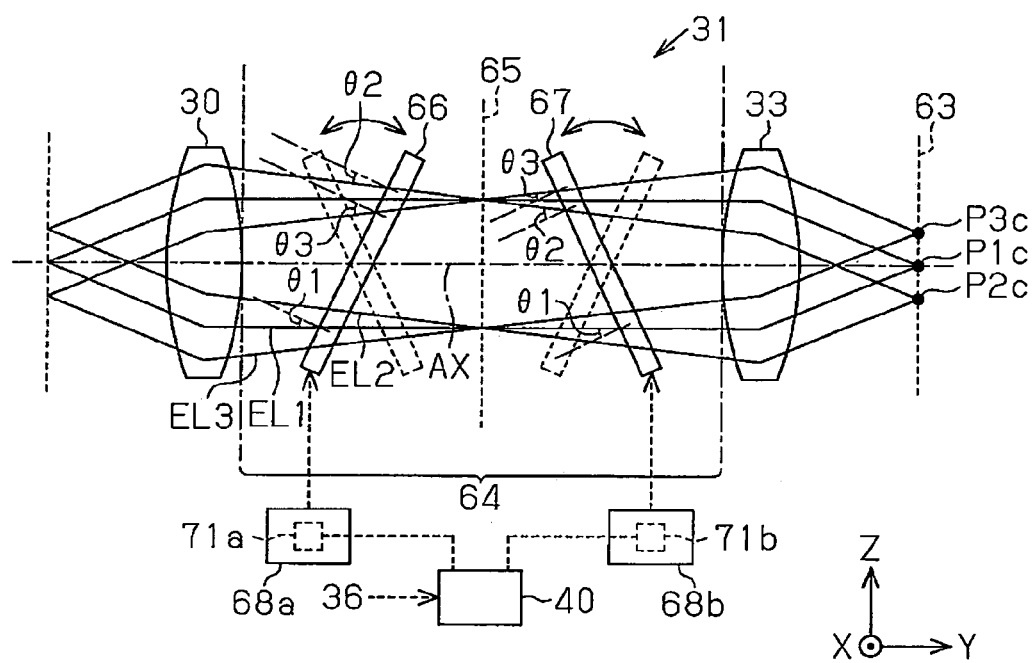
FIG. 14 is an exemplary schematic configuration diagram showing the distribution correction optical system in the second embodiment.

Next, the distribution correction optical system 31 in the second embodiment will be described on the basis of FIG. 14. In FIG. 14, the conjugate center point P1c corresponding to the center point P1b in the still exposure region ER2, and the conjugate peripheral points P2c, P3c individually corresponding to the respective peripheral points P2b, P3b are shown at the image-plane conjugate position 63 (the position indicated by a dashed line in FIG. 14) optically conjugate with the surface Wa of the wafer W.

As shown in FIG. 14, the distribution correction optical system 31 is provided with a plurality of (two in the second embodiment) transmission filters 66, 67 arranged in the adjustment region 64 formed between the second condenser optical system 30 and the entrance-side lens unit 33 and near the pupil conjugate plane 65 optically conjugate with the illumination pupil plane 27. Each of these transmission filters 66, 67 is configured so that the beam of exposure light EL emitted from the secondary light source 60 formed on the illumination pupil plane 27 is incident thereinto. The first transmission filter 66 out of the transmission filters 66, 67 is arranged between the second condenser optical system 30 and the pupil conjugate plane 65 and the second transmission filter 67 is arranged between the pupil conjugate plane 65 and the entrance-side lens unit 33. Specifically, the transmission filters 66, 67 are arranged so that when the entrance planes thereof are arranged so as to be perpendicular to the optical axis AX of the illumination optical system 13, the distances to the pupil conjugate plane 65 are approximately equal to each other. Each of the transmission filters 66, 67 has a predetermined rotation axis (not shown) extending along the X-axis direction and each transmission filter 66, 67 is rotatable around an axis on the rotation axis.

Figure 10:
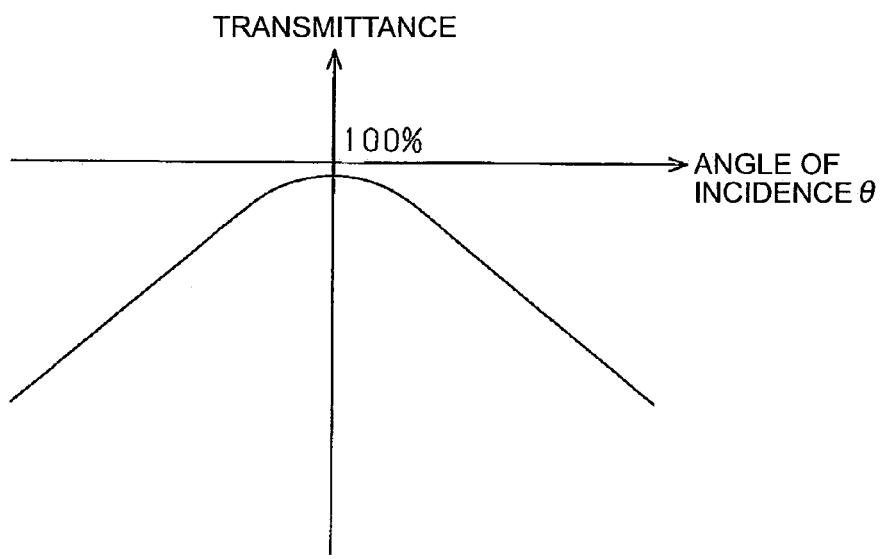
FIG. 10 is an exemplary graph showing a transmittance characteristic of each transmission filter.

Each of the transmission filters 66, 67 has a transmittance characteristic varying according to angles of incidence θ of the exposure light EL, as shown in FIG. 10 in the first embodiment. Namely, each of the transmission filters 66, 67 has the highest transmittance when the exposure light EL is incident thereinto at the incidence angle θ of "0°." On the other hand, the transmittance of each transmission filter 66, 67 gradually decreases as the absolute value of the incidence angle θ of the exposure light EL incident into each transmission filter 66, 67 increases from "0." Each transmission filter 66, 67 is constructed by forming on a glass plate a dielectric multilayer film designed so as to minimize change in degree of polarization according to the incidence angles θ of light.

The distribution correction optical system 31, as shown in FIG. 14, is provided with a first rotation mechanism 68a for rotating the first transmission filter 66 and a second rotation mechanism 68b for rotating the second transmission filter 67. These rotation mechanisms 68a, 68b have a first drive source 71a and a second drive source 71b, respectively, for driving the respective transmission filters 66, 67 so as to rotate them, and each of the drive sources 71a, 71b is driven in accordance with a control command from the control unit 40. Furthermore, the distribution correction optical system 31 is provided with an unillustrated reciprocal movement device for reciprocally moving each of the transmission filters 66, 67 between two positions inside and outside the optical path of the exposure light EL, and the reciprocal movement device is driven in accordance with a control command from the control unit 40.

The control unit 40 in the second embodiment calculates each of pupil intensity distributions in the secondary light source 60 corresponding to the respective points along the Y-axis direction in the still exposure region ER2 on the wafer W, based on detection signals from the pupil intensity distribution measuring device 36. Then the control unit 40 individually controls degrees of rotation of the respective transmission filters 66, 67 so as to approximately equalize the light intensities of the respective pupil intensity distributions corresponding to the respective points along the Y-axis direction in the still exposure region ER2.

Next, the action in adjustment of the pupil intensity distributions corresponding to the respective points P1b, P2b, P3b along the Y-axis direction in the still exposure region ER2 will be described on the basis of FIGS. 15 to 17. On the illumination pupil plane 27 and the pupil conjugate plane conjugate with the illumination pupil plane 27 (e.g., the pupil conjugate plane 65), let us define a first pupil intensity distribution as a pupil intensity distribution corresponding to the center point P1$b$, a second pupil intensity distribution as a pupil intensity distribution corresponding to the peripheral point P2$b$, and a third pupil intensity distribution as a pupil intensity distribution corresponding to the peripheral point P3$b$.

When the exposure light EL is emitted from the light source device 12, the exposure light EL of the circular cross section through the diffraction optical element 19 is incident into the optical integrator 26. Then, the secondary light source 60 having the surface illuminant 60$a$ of the circular shape is formed on the illumination pupil plane 27 located on the exit side of the optical integrator 26. The exposure light EL emitted from this secondary light source 60 travels through the first condenser optical system 28, reticle blind 29, and second condenser optical system 30 to enter the first transmission filter 66. On this occasion, the first incident beam EL1 to enter the center point P1$b$ in the still exposure region and the second incident beam EL2 and the third incident beam EL3 to enter the respective peripheral points P2$b$, P3$b$, in the exposure light EL are incident at mutually different angles of incidence $\theta 1$, $\theta 2$, $\theta 3$ to the first transmission filter 66, into the first transmission filter 66.

Figure 15A:
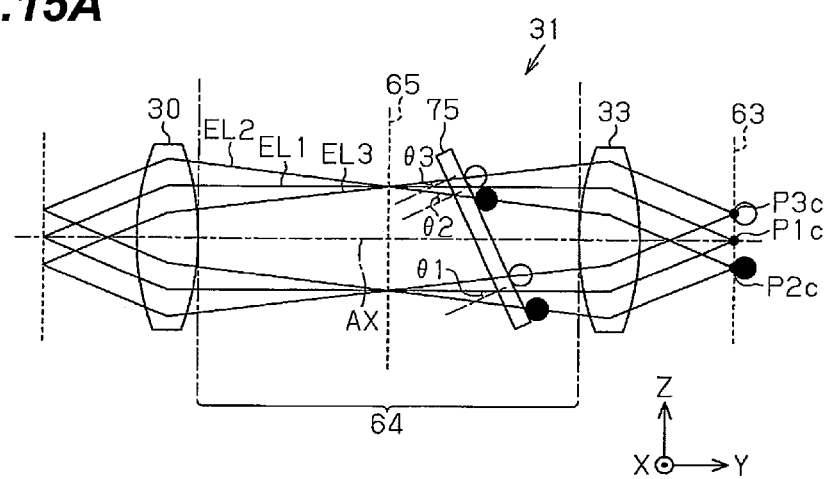
FIG. 15A is an exemplary schematic configuration diagram showing a situation in which only one transmission filter is disposed in an adjustment region and FIG. 15B is an exemplary graph showing a relation of angle of incidence versus transmittance.

If the system is configured with only one transmission filter 75 arranged in the adjustment region 64 as shown in FIG. 15A, the incidence angles $\theta 1$-$\theta 3$ of the respective incident beams EL1-EL3 to the transmission filter 75 are as follows. For example, when the transmission filter 75 is arranged between the pupil conjugate plane 65 and the entrance-side lens unit 33 in the adjustment region 64 and the transmission filter 75 is rotated in the direction shown in FIG. 15A, the absolute value of the second incidence angle $\theta 2$ of the second incident beam EL2 to the transmission filter 75 is larger than the absolute values of the first incidence angle $\theta 1$ and the third incidence angle $\theta 3$ of the first incident beam EL1 and the third incident beam EL3 to the transmission filter 75. The absolute value of the third incidence angle $\theta 3$ is smaller than the absolute value of the first incidence angle $\theta 1$. Then, the transmittance of the transmission filter 75 for the second incident beam EL2 becomes smaller than the transmittances of the transmission filter 75 for the other incident beams EL1, EL3, as indicated by a solid line in FIG. 15B, and the transmittance of the transmission filter 75 for the first incident beam EL1 becomes smaller than the transmittance of the transmission filter 75 for the third incident beam EL3. For this reason, a change amount of the light intensity of the second pupil intensity distribution corresponding to the peripheral point P2$b$ in the still exposure region ER2 becomes larger than change amounts of the light intensities of the first pupil intensity distribution and the third pupil intensity distribution corresponding to the other points P1$b$, P3$b$. Furthermore, the change amount of the light intensity of the first pupil intensity distribution corresponding to the center point P1$b$ is larger than the change amount of the light intensity of the third pupil intensity distribution corresponding to the peripheral point P3$b$.

Figure 15B:
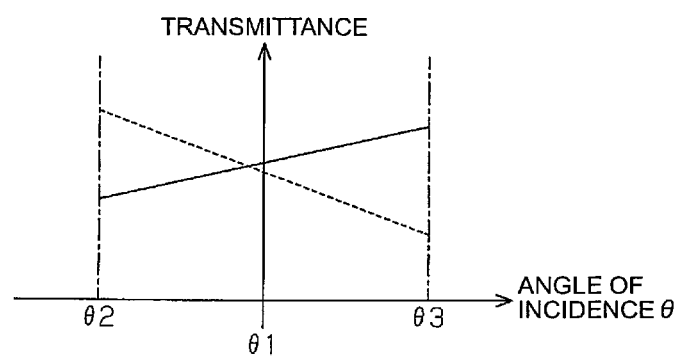

On the other hand, when the transmission filter 75 is inclined in the direction opposite to that in the case shown in FIG. 15A, with respect to the optical axis AX of the illumination optical system 13, the transmittance of the transmission filter 75 for the third incident beam EL3, as indicated by a dashed line in FIG. 15B, becomes smaller than the respective transmittances of the transmission filter 75 for the other incident beams EL1, EL2. As a result, out of the first, second, and third pupil intensity distributions, the change amount of the light intensity of the third pupil intensity distribution becomes the largest, the change amount of the light intensity of the first pupil intensity distribution is the second largest, and the change amount of the light intensity of the second pupil intensity distribution is the smallest.

Namely, in the case of the configuration where only one transmission filter 75 is arranged, the light intensities of the pupil intensity distributions are allowed to be adjusted only in a linear function manner for the respective points P1$b$, P2$b$, P3$b$ along the Y-axis direction in the still exposure region ER2. For this reason, in a situation where the light intensities of the second and third pupil intensity distributions were greater than the light intensity of the first pupil intensity distribution, the above configuration failed to adjust the light intensities of the respective pupil intensity distributions to light intensities at the same level.

Figure 16A:
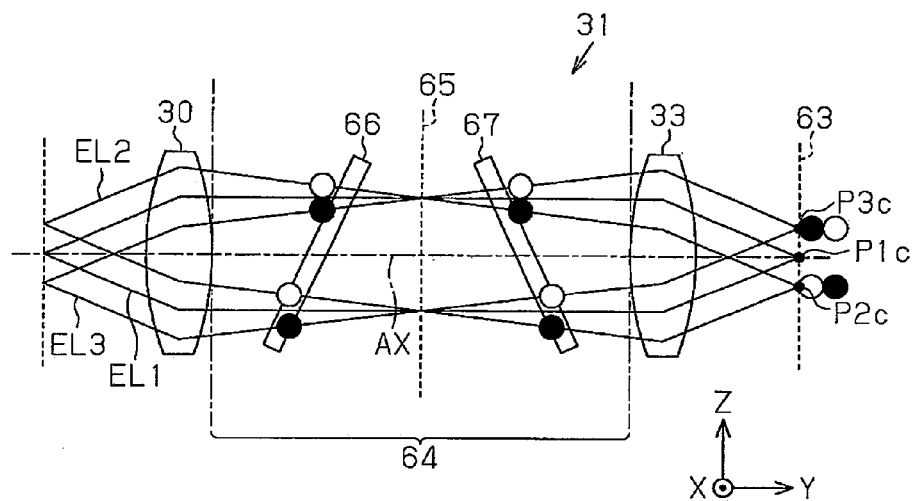
FIG. 16A is an exemplary schematic configuration diagram showing a situation in which transmission filters are rotated in directions opposite to each other.
Figure 16B:
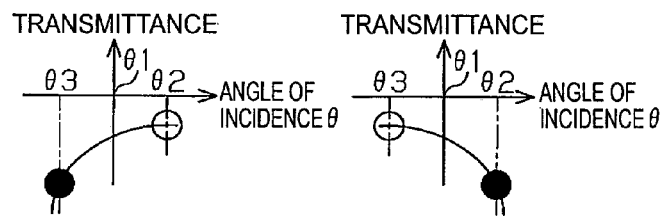
FIG. 16B is an exemplary graph showing a relation of angle of incidence versus transmittance upon passage through the first transmission filter and a graph showing a relation of angle of incidence versus transmittance upon passage through the second transmission filter.

With respect to this point, the second embodiment has the first transmission filter 66 and the second transmission filter 67 arranged on both sides of the pupil conjugate plane 65 in the adjustment region 64 (cf. FIG. 14). When the direction of rotation of the first transmission filter 66 is opposite to the direction of rotation of the second transmission filter 67 as shown in FIG. 16A, the light intensities of the first, second, and third pupil intensity distributions corresponding to the respective points P1$b$, P2$b$, P3$b$ in the still exposure region ER2 each are adjusted as described below. Namely, when the exposure light EL passes through the first transmission filter 66, the absolute value of the second incidence angle $\theta 2$ of the second incident beam EL2 to enter the peripheral point P2$b$, relative to the first transmission filter 66 is the smallest and the absolute value of the first incidence angle $\theta 1$ of the first incident beam EL1 to enter the center point P1$b$, relative to the first transmission filter 66 is the second smallest. Then, as shown in FIG. 16B, the transmittance of the first transmission filter 66 for the second incident beam EL2 becomes larger than the respective transmittances of the first transmission filter 66 for the first incident beam EL1 and the third incident beam EL3. As a result, a change amount of the light intensity of the second pupil intensity distribution based on the action of the first transmission filter 66 is smaller than change amounts of the respective light intensities of the first and third pupil intensity distributions. The change amount of the light intensity of the first pupil intensity distribution based on the action of the first transmission filter 66 is smaller than the change amount of the light intensity of the third pupil intensity distribution. When the first transmission filter 66 is rotated in the direction opposite to the direction in the case of FIG. 16A, the change amount of the light intensity of the third pupil intensity distribution becomes smaller than the change amounts of the respective light intensities of the first and second pupil intensity distributions.

Then the exposure light EL passing through the first transmission filter 66 is incident into the second transmission filter 67 as shown in FIG. 16A. On this occasion, the direction of rotation of the second transmission filter 67 is opposite to the direction of rotation of the first transmission filter 66. For this reason, the absolute value of the second incidence angle $\theta 2$ of the second incident beam EL2 to the second transmission filter 67 is the largest and the absolute value of the first incidence angle $\theta 1$ of the first incident beam EL1 to the second transmission filter 67 is the second largest. Namely, as shown in FIG. 16B, the transmittance of the second transmission filter 67 for the second incident beam EL2 becomes smaller than the respective transmittances of the second transmission filter 67 for the first incident beam EL1 and the third incident beam EL3. As a result, a change amount of the light intensity of the third pupil intensity distribution based on the action of the second transmission filter 67 is smaller than change amounts of the respective light intensities of the first and second pupil intensity distributions. The change amount of the light intensity of the first pupil intensity distribution based on the action of the second transmission filter 67 is smaller than the change amount of the light intensity of the second pupil intensity distribution.

Figure 16C:
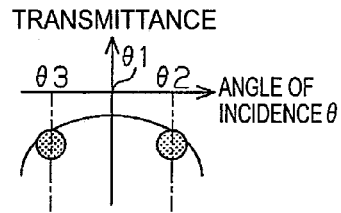
FIG. 16C is an exemplary graph showing a relation of angle of incidence versus transmittance upon passage through both of the first and second transmission filters.

For this reason, at the image-plane conjugate position 63 located on the reticle R side of the transmission filters 66, 67 out of the image-plane conjugate positions optically conjugate with the surface Wa of the wafer W, as shown in FIG. 16C, the change amount of the light intensity of the first pupil intensity distribution corresponding to the center point P1$b$ becomes smaller than the change amounts of the respective light intensities of the second and third pupil intensity distributions corresponding to the peripheral points P2$b$, P3$b$ by virtue of the actions of the respective transmission filters 66, 67. Namely, in the second embodiment the light intensities of the pupil intensity distributions corresponding to the respective points along the Y-axis direction in the still exposure region ER2 can be adjusted in a quadratic function manner along the Y-axis direction by virtue of the actions of the respective transmission filters 66, 67. Therefore, in the case where on the illumination pupil plane 27 of the optical integrator 26 the light intensity of the first pupil intensity distribution corresponding to the center point P1$b$ is smaller than the respective light intensities of the second and third pupil intensity distributions corresponding to the peripheral points P2$b$, P3$b$, the light intensities for the respective points P1$b$, P2$b$, P3$b$ along the Y-axis direction in the still exposure region ER2 are made approximately equal to each other by rotating the transmission filters 66, 67 in directions opposite to each other.

Figure 17A:
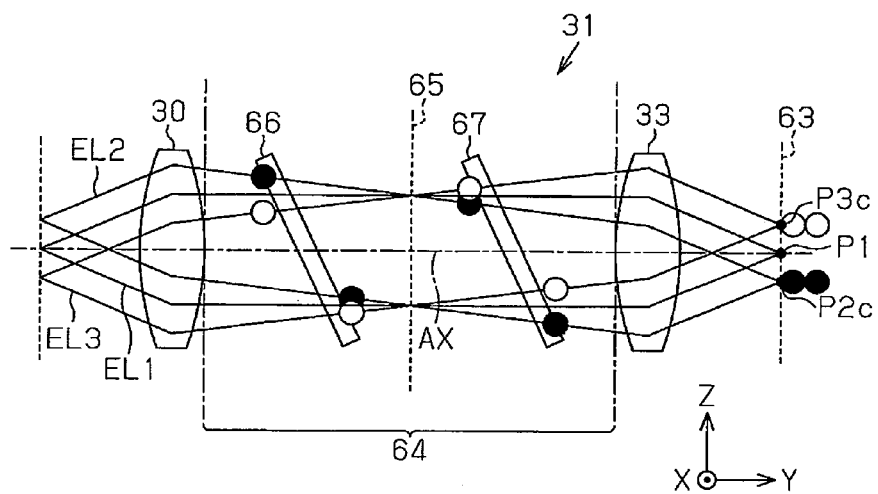
FIG. 17A is an exemplary schematic configuration diagram showing a situation in which the transmission filters are rotated in the same direction.
Figure 17B:
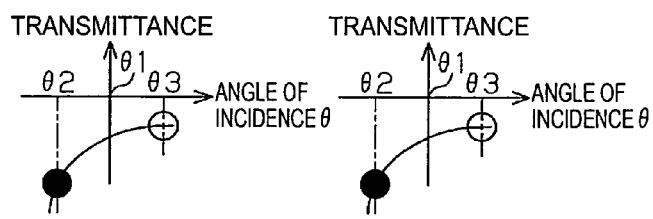
FIG. 17B is an exemplary graph showing a relation of angle of incidence versus transmittance upon passage through the first transmission filter and a graph showing a relation of angle of incidence versus transmittance upon passage through the second transmission filter.

When the transmission filters 66, 67 are rotated in the same direction, as shown in FIGS. 17A and 17B, the second incidence angle θ2 of the second incident beam EL2 to the first transmission filter 66 becomes larger than the first incidence angle θ1 and the third incidence angle θ3 of the first incident beam EL1 and the third incident beam EL3 to the first transmission filter 66. As a result, the transmittance of the second incident beam EL2 to the first transmission filter 66 is smaller than the respective transmittances of the first incident beam EL1 and the third incident beam EL3 to the first transmission filter 66. The transmittance of the first incident beam EL1 to the first transmission filter 66 is smaller than the transmittance of the third incident beam EL3 to the first transmission filter 66.

Then the exposure light EL passing through the first transmission filter 66 is incident into the second transmission filter 67 as shown in FIG. 17A. On this occasion, the second incidence angle θ2 of the second incident beam EL2 to the second transmission filter 67 is larger than the first incidence angle θ1 and the third incidence angle θ3 of the first incident beam EL1 and the third incident beam EL3 to the second transmission filter 67. As a result, the transmittance of the second incident beam EL2 to the second transmission filter 67 is smaller than the respective transmittances of the first incident beam EL1 and the third incident beam EL3 to the second transmission filter 67. The transmittance of the first incident beam EL1 to the second transmission filter 67 is smaller than the transmittance of the third incident beam EL3 to the second transmission filter 67.

Figure 17C:
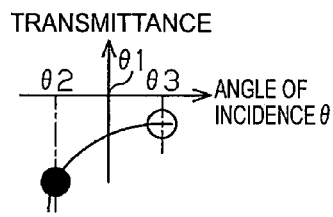
FIG. 17C is an exemplary graph showing a relation of angle of incidence versus transmittance upon passage through both of the first and second transmission filters.

For this reason, at the image-plane conjugate position 63 located on the reticle R side of the transmission filters 66, 67 out of the image-plane conjugate positions optically conjugate with the surface Wa of the wafer W, as shown in FIG. 17C, a change amount of the light intensity of the second pupil intensity distribution corresponding to the peripheral point P2$b$ becomes larger than change amounts of the respective light intensities of the first and third pupil intensity distributions corresponding to the center point P1$b$ and the peripheral point P3$b$ by virtue of the actions of the respective transmission filters 66, 67. Namely, in the second embodiment, the pupil intensity distributions corresponding to the respective points along the Y-axis direction in the still exposure region ER2 can be adjusted in a linear function manner along the Y-axis direction by rotating the transmission filters 66, 67 in the same direction. Therefore, in the case where on the illumination pupil plane 27 of the optical integrator 26 the light intensity of the second pupil intensity distribution is larger than the light intensities of the first and third pupil intensity distributions and the light intensity of the third pupil intensity distribution is smaller than the light intensity of the first pupil intensity distribution, the light intensities for the respective points P1$b$, P2$b$, P3$b$ along the Y-axis direction in the still exposure region ER2 are made approximately equal to each other by rotating the transmission filters 66, 67 in the same direction.

Therefore, the second embodiment can achieve the effects described below, in addition to the effects in the first embodiment.

(5) The light intensity distributions in the illumination region ER1 on the illumination target surface Ra of the reticle R and in the still exposure region ER2 on the surface Wa of the wafer W are adjusted by rotating the first and second transmission filters 66, 67 arranged in the optical path of the exposure light EL. For this reason, the light intensities of the respective pupil intensity distributions corresponding to the respective points P1$a$-P3$a$, P1$b$-P3$b$ in the illumination region ER1 and in the still exposure region ER2 can be independently adjusted by rotation of the transmission filters 66, 67.

(6) If the system is configured with only one transmission filter in the adjustment region 64, the light intensities of the respective pupil intensity distributions are allowed to be adjusted only in a linear function manner for the respective points P1$b$, P2$b$, P3$b$ along the Y-axis direction in the still exposure region ER2. In addition, where one desires to increase the differences among the change amounts of the light intensities of the first, second, and third pupil intensity distributions, i.e., where one desires to increase the slope of each line in FIG. 15B, it is necessary to increase the angle of inclination of the transmission filter relative to the optical axis AX of the illumination optical system 13 (which will be referred to hereinafter as "first inclination angle"). With respect to this point, the second embodiment has the two transmission filters 66, 67 arranged along the optical axis AX of the illumination optical system 13 in the adjustment region 64. The light intensities of the respective pupil intensity distributions can be adjusted in a linear function manner for the respective points P1$b$, P2$b$, P3$b$ along the Y-axis direction in the still exposure region ER2, by rotating these transmission filters 66, 67 in the same rotation direction. In addition, much the same effect as in the case of the configuration where only one transmission filter is arranged in the adjustment region 64 can be achieved by setting the angle of inclination of each transmission filter 66, 67 relative to the optical axis AX (which will be referred to hereinafter as "second inclination angle") to about half of the foregoing first inclination angle. Namely, a variable range of rotation angles of the transmission filters 66, 67 can be made smaller than in the case of the configuration where only one transmission filter is arranged in the adjustment region 64.

Third Embodiment

The third embodiment will be described below according to FIG. 18. The third embodiment is different in the configuration of the distribution correction optical system from the second embodiment. Therefore, the below will mainly describe the differences from the third embodiment and identical or equivalent members to those in the third embodiment will be denoted by the same reference signs, without redundant description.

Figure 18:
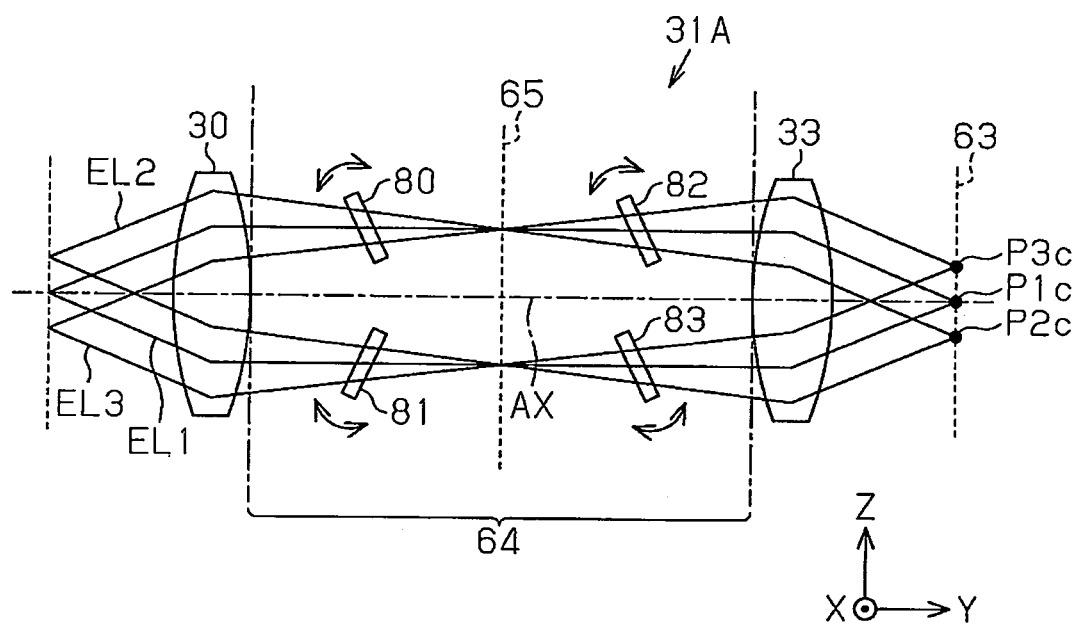
FIG. 18 is an exemplary schematic configuration diagram showing the distribution correction optical system in the third embodiment.

As shown in FIG. 18, the distribution correction optical system 31A in the third embodiment is provided with a plurality of (two in the third embodiment) first transmission filters 80, 81 arranged on the second condenser optical system 30 side with respect to the pupil conjugate plane 65 in the adjustment region 64, and a plurality of (two in the third embodiment) second transmission filters 82, 83 arranged on the entrance-side lens unit 33 side with respect to the pupil conjugate plane 65 in the adjustment region 64. The first transmission filters 80, 81 each are arranged approximately at the same position in the Y-axis direction. The first transmission filter 80 located on the +Z-directional side (the upper side in FIG. 18) is arranged so that the exposure light EL emitted from a first region out of a plurality of regions forming the secondary light source 60 formed on the illumination pupil plane 27 located on the exit side of the optical integrator 26 is incident thereinto. The first transmission filter 81 located on the −Z-directional side (the lower side in FIG. 18) is arranged so that the exposure light EL emitted from a second region different from the first region out of the plurality of regions forming the secondary light source 60 is incident thereinto. The first region and the second region may overlap in part in the secondary light source 60.

The second transmission filters 82, 83 each are arranged approximately at the same position in the Y-axis direction. The second transmission filter 82 located on the +Z-directional side is arranged so that the exposure light EL emitted from the first region out of the plurality of regions forming the secondary light source 60, i.e., the exposure light EL having passed through the first transmission filter 80 is incident thereinto. The second transmission filter 83 located on the −Z-directional side is arranged so that the exposure light EL emitted from the second region out of the plurality of regions forming the secondary light source 60, i.e., the exposure light EL having passed through the first transmission filter 81 is incident thereinto.

Namely, in the third embodiment the first transmission filter 80 or 81 and the second transmission filter 82 or 83 are provided for each of the beams of exposure light EL emitted from the respective regions in the secondary light source 60. For this reason, through individual adjustment of rotation of the transmission filters 80-83, the distribution correction optical system 31A in the third embodiment can apply mutually different light extinction actions to the first incident beam EL1, which is to enter the center point P1b in the still exposure region ER2, of the exposure light EL emitted from the first region and to the first incident beam EL1 of the exposure light EL emitted from the second region. Similarly, the distribution correction optical system 31A can apply mutually different light extinction actions to the second incident beam EL2 and the third incident beam EL3, which are to enter the peripheral points P2b, P3b in the still exposure region ER2, of the exposure light EL emitted from the first region and to the second incident beam EL2 and the third incident beam EL3 of the exposure light EL emitted from the second region.

Therefore, the third embodiment can further achieve the effect described below, in addition to the effects in the second embodiment.

(7) In the third embodiment, the first transmission filter 80 and the second transmission filter 82 are arranged in the optical path of the exposure light EL emitted from the first region of the secondary light source 60 formed on the illumination pupil plane 27 located on the exit side of the optical integrator 26. The first transmission filter 81 and the second transmission filter 83 are arranged in the optical path of the exposure light EL emitted from the second region of the secondary light source 60. For this reason, the exposure light EL emitted from the secondary light source 60 is adjusted for each of the regions in the secondary light source 60 by the actions of the respective transmission filters 80-83. For this reason, the first, second, and third pupil intensity distributions corresponding to the respective points P1b, P2b, P3b in the still exposure region ER2 can be adjusted in greater detail than in the case of the second embodiment.

The above-described embodiments may be modified into other embodiments as described below.

In the first embodiment, the diffraction optical element 19 may be a diffraction optical element for any multi-polar illumination (e.g., for dipolar illumination) other than the quadrupolar illumination, or a diffraction optical element for annular illumination, or a diffraction optical element for circular shape. In the second and third embodiments, the diffraction optical element 19 may be a diffraction optical element for multi-polar illumination (e.g., for quadrupolar illumination) or a diffraction optical element for annular illumination. In each of the embodiments, any other optical element such as an axicon lens pair may be arranged instead of the diffraction optical element 19 or in addition to the diffraction optical element 19 as long as it is an optical element capable of modifying the shape of the exposure light EL. The illumination optical system with the axicon lens pair is disclosed, for example, in U.S. Patent Application Laid-Open No. 2006/0170901. In the embodiment shown in FIG. 1, the axicon lens pair can be arranged near the correction filter 24.

In each of the embodiments, the diffraction optical element 19 may be replaced by a spatial light modulator, for example, composed of a large number of microscopic element mirrors arranged in an array form and individually driven and controlled in their angle and direction of inclination, which is arranged to divide an incident beam into microscopic units corresponding to respective reflective faces and to deflect the microscopic beam units, thereby converting a cross section of the beam into a desired shape or desired size. The illumination optical system using such a spatial light modulator is disclosed, for example, in Japanese Patent Application Laid-Open No. 2002-353105.

For example, in the case where the secondary light source of the annular shape or the secondary light source of the circular shape is formed on the illumination pupil plane 27, the first region to emit the exposure light EL of the illumination beam passing through the first transmission filter 66 and the second region to emit the exposure light EL of the illumination beam passing through the second transmission filter 67 may overlap in part on the illumination pupil plane 27.

Figure 11:
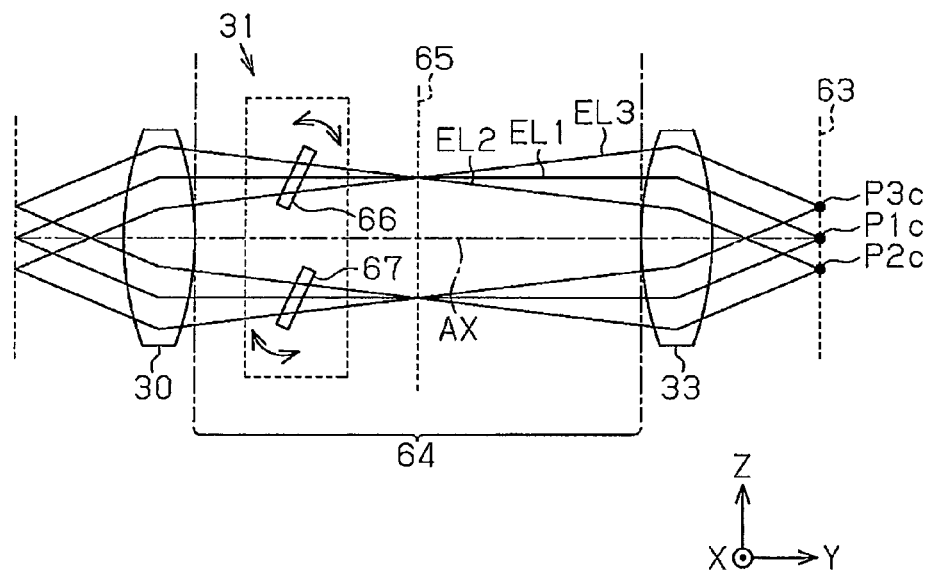
FIG. 11 is an exemplary schematic configuration diagram showing the distribution correction optical system in a modification example.

In the first embodiment, the transmission filters 66, 67 may be arranged on the light source device 12 side with respect to the pupil conjugate plane 65, as shown in FIG. 11, as long as they are located in the adjustment region 64. This configuration can also achieve the same operational effects as the first embodiment.

It is also possible to adopt a configuration wherein the first transmission filter 66 is arranged on the reticle R side with respect to the pupil conjugate plane 65 and the second transmission filter 67 is arranged on the light source device 12 side with respect to the pupil conjugate plane 65. In this configuration, the first transmission filter 66 is arranged in the optical path of the exposure light EL emitted from the third surface illuminant 60c of the secondary light source 60 and the second transmission filter 67 is arranged in the optical path of the exposure light EL emitted from the fourth surface illuminant 60d of the secondary light source 60; therefore, this configuration can also achieve the same operational effects as the first embodiment.

In the third embodiment, the first transmission filter and the second transmission filter may be provided for each of surface illuminants of four poles constituting the secondary light source 60 formed in the case where the diffraction optical element 19 is a diffraction optical element for multi-polar illumination (e.g., for quadrupolar illumination). In this case, each of beams of the exposure light EL emitted from the quadrupolar surface illuminants is individually adjusted by the first transmission filter and the second transmission filter individually corresponding thereto.

In the third embodiment, it is also possible to adopt a configuration wherein only one first transmission filter is arranged on the second condenser optical system 30 side with respect to the pupil conjugate plane 65 in the adjustment region 64. In this case, the first transmission filter may be configured so that all the beams emitted from the secondary light source 60 are incident thereinto.

Similarly, in the third embodiment, it is also possible to adopt a configuration wherein only one second transmission filter is arranged on the entrance-side lens unit 33 side with respect to the pupil conjugate plane 65 in the adjustment region 64. In this case, the second transmission filter may be configured so that all the beams emitted from the secondary light source 60 are incident thereinto.

Figure 19:
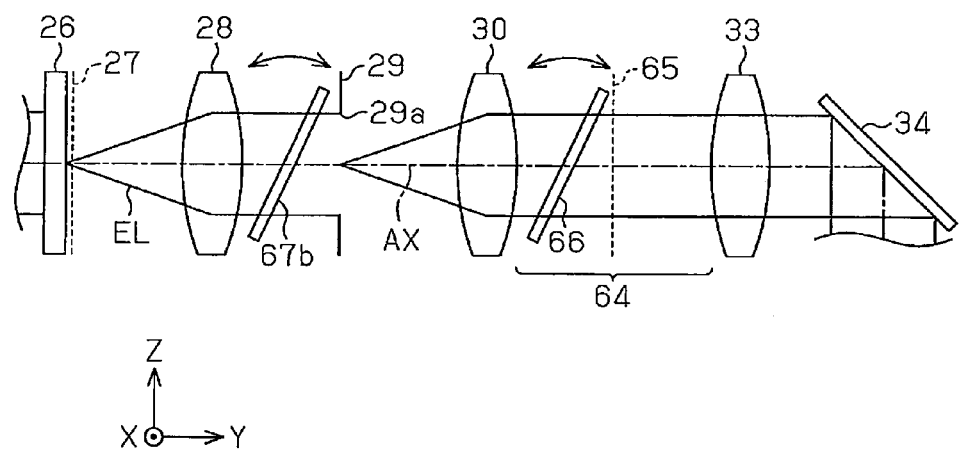
FIG. 19 is an exemplary schematic configuration diagram showing the distribution correction optical system in another modification example.

In the second embodiment, the second transmission filter 67b may be arranged, as shown in FIG. 19, between the first condenser optical system 28 and the reticle blind 29. In this case, the second transmission filter 67 does not have to be provided on the entrance-side lens unit 33 side with respect to the pupil conjugate plane 65 in the adjustment region 64. This configuration can also achieve the same operational effects as the second embodiment.

Similarly, in the third embodiment, the second transmission filters 82, 83 may be arranged between the first condenser optical system 28 and the reticle blind 29.

In the second and third embodiments, the transmission filters 66, 67, 80-83 may be arranged so that the distance between the first transmission filter 66, 80, 81 and the pupil conjugate plane 65 is different from the distance between the second transmission filter 67, 82, 83 and the pupil conjugate plane 65.

In each of the embodiments, an optical element without power (e.g., a plane-parallel plate) may be arranged in the adjustment region 64. However, the optical element without power can be arranged at a position where it does not interfere with the transmission filters 66, 67, 80-83 configured to rotate. The transmission filters 66, 67, 80-83 may be arranged each in the adjustment region bounded by a pair of optical elements without power arranged along the optical-axis direction of the illumination optical system 13 as long as they are located on the reticle R side with respect to the illumination pupil plane 27 and near the pupil conjugate plane optically conjugate with the illumination pupil plane 27.

In each of the embodiments, the adjustment region may be set near the position where the reticle blind 29 is installed. In the case of the first embodiment, the adjustment region is set in the region between the first condenser optical system 28 and the second condenser optical system. In the case of the second and third embodiments, the reticle blind 29 is arranged between the first transmission filter 66, 80, 81 and the second transmission filter 67, 82, 83.

In the first embodiment, the adjustment region may be the region between the illumination pupil plane 27 and the first condenser optical system 28. In this case, the transmission filters 66, 67 are arranged each in the region between the illumination pupil plane 27 and the first condenser optical system 28.

In the first embodiment, the transmission filters 66, 67 may be arranged, as shown in FIG. 11, in the optical paths of the respective beams of exposure light EL emitted from the third surface illuminant 60c and the fourth surface illuminant 60d of the secondary light source 60. In this case, in the pupil intensity distributions 61, 62 corresponding to the respective points P1b, P2b, P3b in the still exposure region ER2 on the wafer W, the third surface illuminants 61c, 62c and the fourth surface illuminants 61d, 62d thereof are adjusted each by rotating the transmission filters 66, 67 around an axis extending in the X-axis direction.

Figure 20:
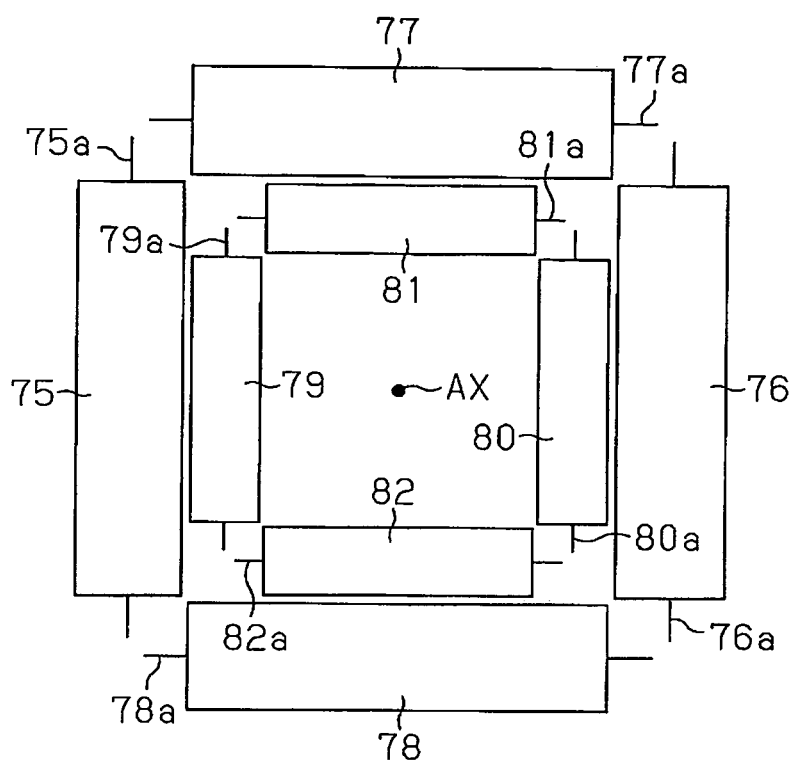
FIG. 20 is an exemplary schematic configuration diagram showing the distribution correction optical system in still another modification example.

In the first embodiment, transmission filters 75, 76, 77, 78 may be arranged, as shown in FIG. 20, in the optical paths of the respective beams of exposure light EL emitted from the respective surface illuminants 60a-60d of the secondary light source 60. These transmission filters 75-78 are configured to rotate around their respective rotation axes 75a, 76a, 77a, 78a.

As shown in FIG. 20, transmission filters 79, 80, 81, 82 arranged in respective optical paths of beams of exposure light EL emitted from positions corresponding to the third region and the fourth region of the illumination pupil plane 27 may be provided inside the transmission filters 75-78 in the radial direction with the center on the optical axis AX of the illumination optical system 13. These transmission filters 79-82 are configured to rotate around their respective rotation axes 79a, 80a, 81a, 82a.

The transmittance characteristics of the respective transmission filters 79-82 for the incidence angles θ of exposure light EL may be characteristics different from the transmittance characteristics of the transmission filters 75-78 located outside in the radial direction, for the incidence angles θ of exposure light EL. In this case, the transmission filters to be used can be optionally used, for example, by changing the beam diameter of the exposure light EL or the distance from the optical axis of the beam incident into the optical integrator 26 by driving the zoom optical system 25.

In the second and third embodiments, the transmittance characteristic of the first transmission filter 66, 80, 81 for the incidence angles θ of exposure light EL may be different from that of the second transmission filter 67, 82, 83 for the incidence angles θ of exposure light EL.

The rotation mechanism 68 in the first embodiment and the rotation mechanisms 68, 69 in the second and third embodiments do not always have to be configured to be driven in synchronism with the measurement results by the pupil intensity distribution measuring device 36. Specifically, it is also possible to adopt a configuration wherein the measurement results by the pupil intensity distribution measuring device 36 are displayed on a display screen such as an unillustrated monitor and an operator rotates each of the transmission filters 66, 67, 80, 81, 82, 83 on the basis of the measurement results displayed on the display screen. In this case, the rotation mechanism 68 does not have to be provided with the drive sources 69, 70. Namely, each of the transmission filters 66, 67, 80, 81, 82, 83 is manually rotated by the operator.

In each of the embodiments, the correction filter 24 may be a filter with any transmittance distribution as long as it is a filter with a transmittance distribution of different transmittances according to positions of incidence of the exposure light EL. For example, the correction filter 24 in the first embodiment may be a filter with a transmittance distribution which brings about great extinction of the beams forming the first surface illuminant 60a and the second surface illuminant 60b along the X-axis direction in the secondary light source 60 formed on the illumination pupil plane 27 and which brings about little extinction of the beams forming the third surface illuminant 60c and the fourth surface illuminant 60d along the Z-axis direction.

In each of the embodiments, it is also possible to adopt a configuration wherein a plurality of correction filters 24 with different transmittance distributions for incidence positions are prepared in such a manner that the correction filter to be arranged in the optical path of exposure light EL can be replaced with another on an as-needed basis. This configuration can increase degrees of freedom for adjustment of the pupil intensity distributions corresponding to the respective points P1b, P2b, P3b in the still exposure region ER2 by the cooperative action of the correction filter 24 and the transmission filters 66, 67, 80, 81, 82, 83.

In each of the embodiments, the pupil intensity distribution measuring device 36 does not always have to be located near the reticle R as long as it can measure the pupil intensity distributions 61, 62 corresponding to the respective points P1a, P2a, P3a in the illumination region ER1 on the reticle R. It should be noted, however, that the pupil intensity distribution measuring device 36 may be located at any position as long as the position is near a position optically conjugate with the illumination target surface Ra of the reticle R (or the surface Wa of the wafer W).

In the first embodiment, in order to maintain the distances from the optical axis AX of the surface illuminants 60a-60d constant even with rotation (inclination) of the transmission filters 66, 67, 79-82, the zoom optical system 25 may be driven according to the rotation (inclination) of the transmission filters 66, 67, 79-82 so as to change the distances from the optical axis AX of the beams incident into the transmission filters 66, 67, 79-82. In the case where the system is provided with the aforementioned axicon lens pair, the spacing of the axicon lens pair may be changed according to the rotation (inclination) of the transmission filters 66, 67, 79-82. For example, by using the axicon lens pair the distances between which can be independently varied for the respective quadrants as disclosed in Japanese Patent Application Laid-Open No. 2003-318087 or a plurality of prism pairs eccentrically arranged as disclosed in Japanese Patent Application Laid-Open No. H11-274060, the distances from the optical axis AX of the respective surface illuminants can be maintained constant even in the case where the rotation angles (inclination angles) of the respective transmission filters 66, 67, 79-82 are different. In the case where the aforementioned spatial light modulator is used instead of the diffraction optical element, the pupil intensity distributions formed by the spatial light modulator are changed according to the rotation angles (inclination angles) of the respective transmission filters 66, 67, 79-82, whereby the distances from the optical axis AX of the respective surface illuminants can be maintained constant even if the rotation angles (inclination angles) of the respective transmission filters 66, 67, 79-82 are different.

In each of the embodiments, the exposure apparatus 11 does not always have to be limited to the exposure apparatus for manufacturing the microdevices such as semiconductor devices, but may be an exposure apparatus which transfers a circuit pattern from a mother reticle onto a glass substrate, a silicon wafer, or the like, in order to manufacture reticles or masks used in an optical aligner, EUV exposure apparatus, X-ray exposure apparatus, electron beam exposure apparatus, and so on. Furthermore, the exposure apparatus 11 may also be an exposure apparatus used in manufacture of displays including liquid crystal display devices (LCD) and others and configured to transfer a device pattern onto a glass plate, an exposure apparatus used in manufacture of thin film magnetic heads and others and configured to transfer a device pattern onto a ceramic wafer or the like, an exposure apparatus used in manufacture of imaging devices such as CCD, and so on.

In each of the embodiments, the exposure apparatus 11 may be embodied as a scanning stepper which transfers a pattern of a reticle R onto a wafer W in a state of relative movement of the reticle R and wafer W and which implements sequential step movement of the wafer W.

In each of the embodiments, the optical integrator 26 may be one composed of a single micro fly's eye lens in which unit wavefront division faces with a refractive index are arrayed along the Z-direction and X-direction. The optical integrator may be a fly's eye lens in which a plurality of lens elements are arrayed. The optical integrator may be a pair of fly's eye mirrors in which a plurality of mirror faces are arrayed. The optical integrator may be a rod type (internal reflection type) integrator extending along the Y-axis direction. When the rod type integrator is used as the optical integrator, a condensing lens system is arranged behind the zoom optical system 25 so that its front focal position coincides with the rear focal position of the zoom optical system 25, and the rod type integrator is arranged so that its entrance end is positioned at or near the rear focal position of the condensing lens system. In this case, an exit end of the rod type integrator is located at the position of the reticle blind 29. In the case of the rod type integrator being used, a position optically conjugate with the position of the aperture stop 42 of the projection optical system 15 in the reticle blind imaging optical system (second condenser optical system 30 and imaging optical system 32) downstream of this rod type integrator can be called an illumination pupil plane. Since a virtual image of the secondary light source on the illumination pupil plane is formed at the position of the entrance surface of the rod type integrator, this position and a position optically conjugate with this position can also be called illumination pupil planes. In this case, the distribution correction optical system 31 can be arranged in a space including this illumination pupil plane (the space between the second condenser optical system 30 and the imaging optical system 32).

In each of the embodiments, the exposure apparatus 11 may be embodied as a maskless exposure apparatus using a variable pattern generator (e.g., DMD (Digital Mirror Device or Digital Micro-mirror Device)). Such maskless exposure apparatus is disclosed, for example, in Japanese Patent Application Laid-Open No. 2004-304135 and U.S. Patent Application Laid-Open No. 2007/0296936.

In each of the embodiments, the light source device 12 may be a light source capable of supplying, for example, the g-line (436 nm), i-line (365 nm), KrF excimer laser (248 nm), $F_2$ laser (157 nm), $Kr_2$ laser (146 nm), $Ar_2$ laser (126 nm), and so on. The light source device 12 may also be a light source capable of supplying a harmonic obtained by amplifying a single wavelength laser beam in the infrared region or in the visible region lased from a DFB semiconductor laser or a fiber laser, for example, by a fiber amplifier doped with erbium (or with both of erbium and ytterbium) and effecting wavelength conversion thereof into ultraviolet light by means of a nonlinear optical crystal.

In each of the embodiments, it is also possible to apply a technique of filling the optical path between the projection optical system and the photosensitive substrate with a medium having the refractive index of more than 1.1 (typically, a liquid), the so-called liquid immersion method. In this case, the technique of filling the optical path between the projection optical system and the photosensitive substrate with the liquid can be selected from the technique of locally filling the space with the liquid as disclosed in International Publication WO99/49504, the technique of moving a stage holding the substrate as an exposed object, in a liquid bath as disclosed in Japanese Patent Application Laid-Open No. H6-124873, the technique of forming a liquid bath in a predetermined depth on a stage and holding the substrate therein as disclosed in Japanese Patent Application Laid-Open No. H10-303114, and so on.

In each of the embodiments, it is also possible to apply the polarized illumination method as disclosed in U.S. Patent Application Laid-Open No. 2006/0203214, U.S. Patent Application Laid-Open No. 2006/0170901, and U.S. Patent Application Laid-Open No. 2007/0146676.

A unit in which the first transmission filter, second transmission filter, and rotation mechanism are integrated is called a transmission filter unit in some cases.

Figure 21:
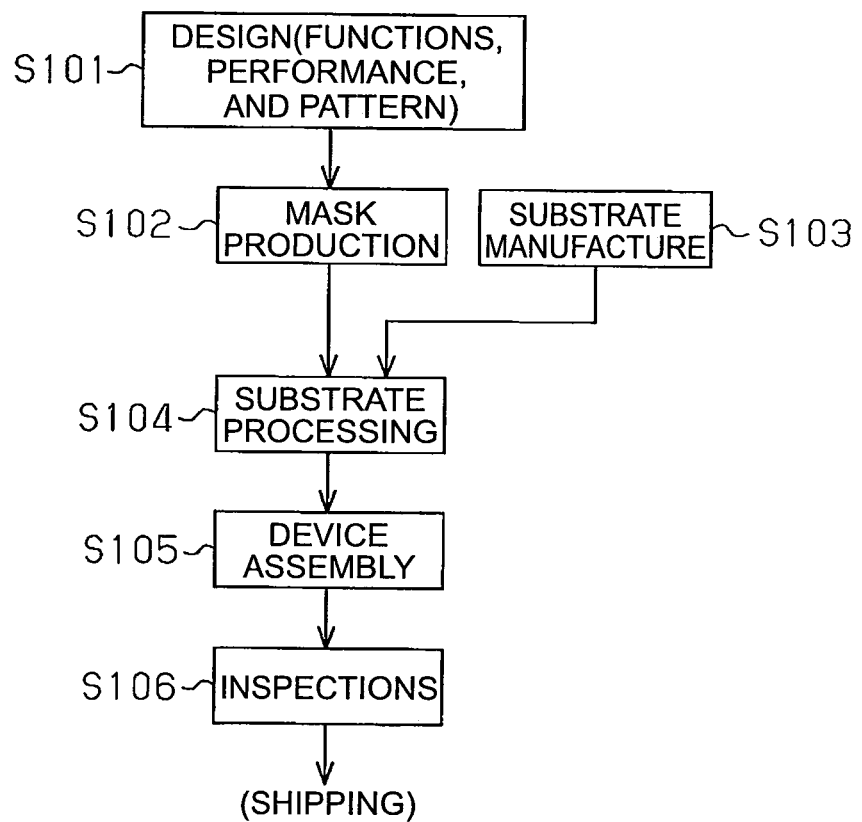
FIG. 21 is an exemplary flowchart of a device manufacturing example.

The following will describe an embodiment of a microdevice manufacturing method using the device manufacturing method with the exposure apparatus 11 in the present embodiment, in a lithography process. FIG. 21 is an exemplary drawing showing a flowchart of a manufacture example of microdevices (semiconductor chips such as IC and LSI, liquid crystal panels, CCDs, thin film magnetic heads, micromachines, and so on).

First, block S101 (design block) is to design functions and performance of microdevices (e.g., circuit design of semiconductor devices or the like) and to design a pattern for realizing the functions. Subsequently, block S102 (mask production block) is to produce a mask (reticle R or the like) on which the designed circuit pattern is formed. On the other hand, block S103 (substrate manufacturing block) is to manufacture a substrate using a material such as silicon, glass, or ceramics (which is a wafer W in the case of the silicon material being used).

Next, block S104 (substrate processing block) is to form an actual circuit and others on the substrate by the lithography technique and others, as described below, using the mask and substrate prepared in blocks S101-S104. Thereafter, block S105 (device assembly block) is to assemble devices, using the substrate processed in block S104. This block S105 includes blocks such as a dicing block, a bonding block, and a packaging block (chip encapsulation) on an as-needed basis. Finally, block S106 (inspection block) is to perform inspections such as an operation check test and a durability test of microdevices fabricated in block S105. The microdevices are completed through these blocks and then they are shipped.

Figure 22:
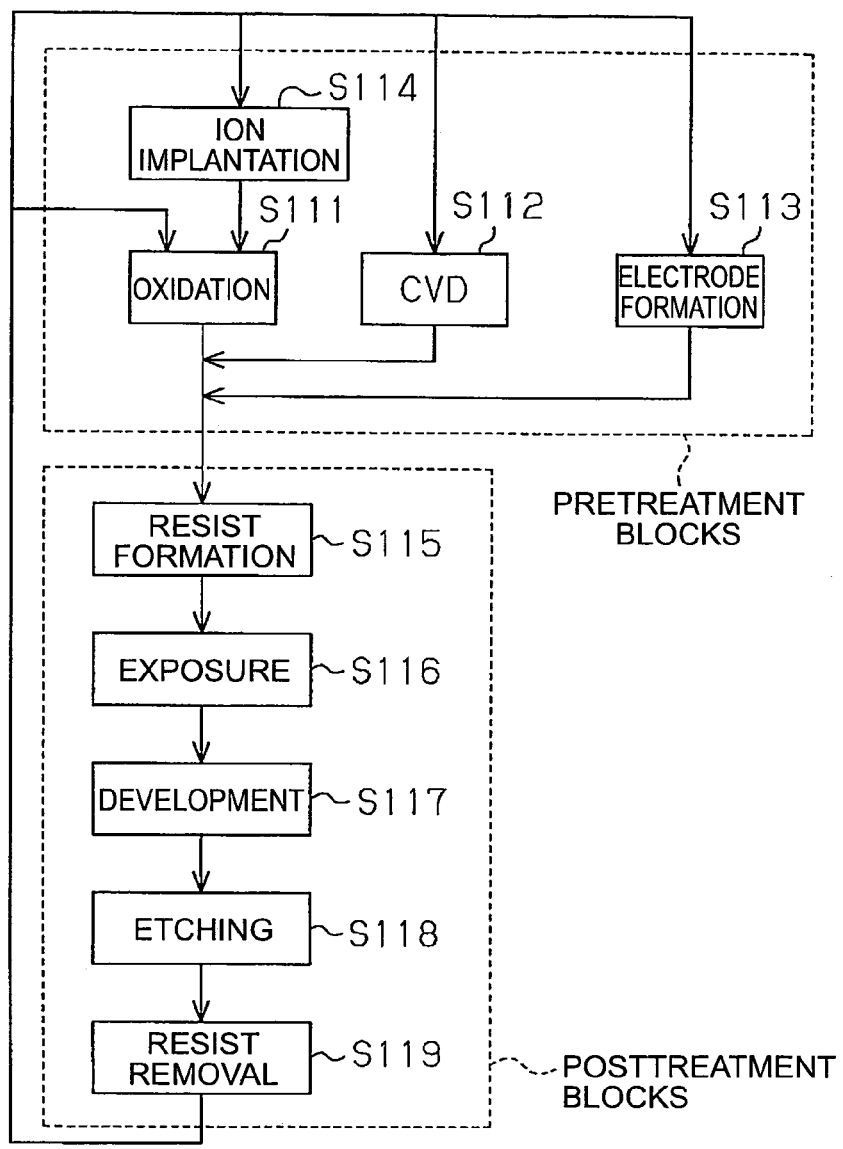
FIG. 22 is an exemplary detailed flowchart about processing of a substrate in the case of semiconductor devices.

FIG. 22 is a drawing showing an example of the detailed blocks of block S104 in the case of semiconductor devices.

Block S111 (oxidation block) is to oxidize the surface of the substrate. Block S112 (CVD block) is to form an insulating film on the surface of the substrate. Block S113 (electrode forming block) is to form electrodes on the substrate by evaporation. Block S114 (ion implantation block) is to implant ions into the substrate. Each of the above blocks S111-S114 constitutes a pretreatment block at each stage of the substrate processing and is selectively executed according to a process necessary at each stage.

After the above-described pretreatment blocks are completed at the respective stages of substrate processing, posttreatment blocks are carried out as described below. In the posttreatment blocks, first, block S115 (resist forming block) is to apply a photosensitive material onto the substrate. Subsequently, block S116 (exposure block) is to transfer the circuit pattern of the mask onto the substrate by the lithography system (exposure apparatus 11) described above. Next, block S117 (development block) is to develop the substrate exposed in block S116 and thereby to form a mask layer consisting of the circuit pattern on the surface of the substrate. Subsequently, block S118 (etching block) is to perform etching to remove the exposed material from the part other than the part on which the resist remains. Thereafter, block S119 (resist removing block) is to remove the photosensitive material unnecessary after completion of the etching. Namely, blocks S118 and S119 are to process the surface of the substrate through the mask layer. These pretreatment blocks and posttreatment blocks are repeatedly carried out, thereby forming multiple circuit patterns on the substrate.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

The invention claimed is:

1. An illumination optical system for illuminating an illumination target surface with light from a light source, comprising:

an optical integrator which forms a predetermined light intensity distribution on an illumination pupil plane in an illumination optical path of the illumination optical system with incidence of the light from the light source thereinto;

a first transmission filter arranged in an optical path of a first illumination beam passing through a first region in the illumination pupil plane and having a transmittance characteristic varying according to angles of incidence of the light;

a second transmission filter arranged in an optical path of a second illumination beam passing through a second region different from the first region in the illumination pupil plane and having a transmittance characteristic varying according to the angles of incidence of the light; and a rotation mechanism which rotates the first and second transmission filters so as to vary an angle of inclination thereof relative to an optical axis of the illumination optical system.

2. The illumination optical system according to claim 1, herein the rotation mechanism has a drive source to implement such drive as to adjust angles of inclination of the first and second transmission filters.

3. The illumination optical system according to claim 2, further comprising:
a measuring device which measures a light intensity distribution in angular directions of a beam arriving at a predetermined point on the illumination target surface; and
a control unit which controls the drive source in accordance with a measurement result by the measuring device.

4. The illumination optical system according to claim 1, wherein the first and second transmission filters are arranged each in an adjustment region set including the illumination pupil plane or a pupil conjugate plane optically conjugate with the illumination pupil plane in an optical-axis direction of the illumination optical system.

5. The illumination optical system according to claim 4, wherein the adjustment region is a region between a first optical element arranged at a position closest to the pupil conjugate plane on the light source side with respect to the pupil conjugate plane and a second optical element arranged at a position closest to the pupil conjugate plane on the illumination target surface side with respect to the pupil conjugate plane.

6. The illumination optical system according to claim 5, wherein at least one optical element out of the first optical element and the second optical element is an optical element having a power.

7. The illumination optical system according to claim 1, further comprising a condenser optical system arranged on the illumination target surface side of the optical integrator, wherein the first and second transmission filters are arranged each in an adjustment region set on the illumination target surface side of the condenser optical system in an optical-axis direction of the light.

8. The illumination optical system according to claim 7, wherein the adjustment region is a region between the condenser optical system and an optical element arranged at a position closest to the condenser optical system on the illumination target surface side with respect to the condenser optical system.

9. The illumination optical system according to claim 8, wherein the optical element includes an optical element having a power.

10. The illumination optical system according to claim 1, wherein the optical integrator has a plurality of unit wavefront division faces arrayed in a surface intersecting with the optical axis.

11. The illumination optical system according to claim 1, wherein the first and second transmission filters are arranged each along a direction substantially perpendicular to the optical axis.

12. The illumination optical system according to claim 1, wherein the first region and the second region have no overlap in the illumination pupil plane.

13. The illumination optical system according to claim 1, further comprising:
a third transmission filter arranged in an optical path of a third illumination beam passing through a third region in the illumination pupil plane and having a transmittance characteristic varying according to the angles of incidence of the light; and
a fourth transmission filter arranged in an optical path of a fourth illumination beam passing through a fourth region in the illumination pupil plane and having a transmittance characteristic varying according to the angles of incidence of the light,
wherein the third region is different from the first region and the second region and the fourth region is different from the first region, the second region, and the third region.

14. The illumination optical system according to claim 13, wherein the third and fourth transmission filters have respective transmittance characteristics different from the transmittance characteristics of the first and second transmission filters for the angles of incidence of the light.

15. The illumination optical system according to claim 13, further comprising an incident mode adjustment optical system arranged on the light source side with respect to the optical integrator and being capable of adjusting an incident mode of light incident into the optical integrator.

16. The illumination optical system according to claim 15, wherein the incident mode of the light is an intensity distribution of light on an entrance surface of the optical integrator.

17. The illumination optical system according to claim 1, further comprising:
a third transmittance filter arranged in an optical path of a third illumination beam passing through a third region in the illumination pupil plane and inside the first transmission filter in a radial direction with a center on the optical axis; and
a fourth transmittance filter arranged in an optical path of a fourth illumination beam passing through a fourth region in the illumination pupil plane and inside the second transmission filter in the radial direction with the center on the optical axis.

18. The illumination optical system according to claim 17, wherein the third and fourth transmission filters have respective transmittance characteristics different from the transmittance characteristics of the first and second transmission filters for the angles of incidence of the light.

19. The illumination optical system according to claim 17, further comprising an incident mode adjustment optical system arranged on the light source side with respect to the optical integrator and being capable of adjusting an incident mode of light incident into the optical integrator.

20. The illumination optical system according to claim 19, wherein the incident mode of the light is an intensity distribution of light on an entrance surface of the optical integrator.

21. The illumination optical system according to claim 1, wherein the illumination optical system is used in combination with a projection optical system for forming a plane optically conjugate with the illumination target surface,
wherein the illumination pupil is formed at a position optically conjugate with an aperture stop of the projection optical system.

22. The illumination optical system according to claim 1, wherein the second transmission filter is arranged on the illumination target surface side with respect to the optical integrator and on the illumination target surface side of at least one of the illumination pupil plane and the pupil conjugate plane.

23. An exposure apparatus comprising the illumination optical system as set forth in claim 1 for guiding the light emitted from the light source to a predetermined pattern on the illumination target surface, wherein an image of a pattern formed by illuminating the predetermined pattern with the light emitted from the illumination optical system is projected onto a substrate coated with a photosensitive material.

24. The exposure apparatus according to claim 23, further comprising a projection optical system for projecting the image of the pattern onto the substrate,
wherein the image of the pattern is projected onto the substrate with relative movement of the pattern and the substrate along a scanning direction relative to the projection optical system.

25. A device manufacturing method comprising:
an exposure block of effecting exposure to print the image of the pattern on a surface of the substrate, using the exposure apparatus as set forth in claim 23;
a development block of developing the substrate to form a mask layer in a shape corresponding to the image of the pattern on the surface of the substrate, after the exposure block; and
a processing block of processing the surface of the substrate through the mask layer, after the development block.

26. An illumination optical system for illuminating an illumination target surface with light from a light source, comprising:
an optical integrator which forms a predetermined light intensity distribution on an illumination pupil plane in an illumination optical path of the illumination optical system with incidence of the light from the light source thereinto;
a first transmission filter arranged on the illumination target surface side with respect to the optical integrator and on the light source side of a pupil conjugate plane optically conjugate with the illumination pupil plane, and having a transmittance characteristic varying according to angles of incidence of the light;
a second transmission filter arranged on the illumination target surface side with respect to the optical integrator and on the illumination target surface side of at least one of the illumination pupil plane and the pupil conjugate plane, and having a transmittance characteristic varying according to the angles of incidence of the light; and
a rotation mechanism which rotates each of the transmission filters so as to vary an angle of inclination thereof relative to an optical axis of the illumination optical system.

27. The illumination optical system according to claim 26, wherein the rotation mechanism has a drive source to implement such drive as to adjust angles of inclination of the first and second transmission filters.

28. The illumination optical system according to claim 27, further comprising:
a measuring device which measures a light intensity distribution in angular directions of a beam arriving at a predetermined point on the illumination target surface; and
a control unit which controls the drive source in accordance with a measurement result by the measuring device.

29. The illumination optical system according to claim 26, wherein the optical integrator has a plurality of unit wavefront division faces arrayed in a surface intersecting with the optical axis.

30. The illumination optical system according to claim 26, wherein the first and second transmission filters are arranged so as to interpose the pupil conjugate plane between the first and second transmission filters in the optical-axis direction.

31. The illumination optical system according to claim 26, wherein the first transmission filter comprises a plurality of first transmission filters provided on the light source side of the pupil conjugate plane and the first transmission filters are arranged in respective optical paths of a plurality of illumination beams passing through respective regions in the illumination pupil plane.

32. The illumination optical system according to claim 31, wherein the second transmission filter comprises a plurality of second transmission filters provided on the illumination target surface side of at least one of the illumination pupil plane and the pupil conjugate plane, and the second transmission filters are arranged in the respective optical paths of the plurality of illumination beams passing through the respective regions in the illumination pupil plane.

33. The illumination optical system according to claim 26, wherein the second transmission filter comprises a plurality of second transmission filters provided on the illumination target surface side of at least one of the illumination pupil plane and the pupil conjugate plane, and the second transmission filters are arranged in respective optical paths of a plurality of illumination beams passing through respective regions in the illumination pupil plane.

34. The illumination optical system according to claim 26, wherein the illumination optical system is used in combination with a projection optical system for forming a plane optically conjugate with the illumination target surface,
wherein the illumination pupil plane is formed at a position optically conjugate with an aperture stop of the projection optical system.

35. An exposure apparatus comprising the illumination optical system as set forth in claim 26 for guiding the light emitted from the light source to a predetermined pattern on the illumination target surface,
wherein an image of a pattern formed by illuminating the predetermined pattern with the light emitted from the illumination optical system is projected onto a substrate coated with a photosensitive material.

36. The exposure apparatus according to claim 35, further comprising a projection optical system for projecting the image of the pattern onto the substrate,
wherein the image of the pattern is projected onto the substrate with relative movement of the pattern and the substrate along a scanning direction relative to the projection optical system.

37. A device manufacturing method comprising:
an exposure block of effecting exposure to print the image of the pattern on a surface of the substrate, using the exposure apparatus as set forth in claim 35;
a development block of developing the substrate to form a mask layer in a shape corresponding to the image of the pattern on the surface of the substrate, after the exposure block; and
a processing block of processing the surface of the substrate through the mask layer, after the development block.

* * * * *